United States Patent
Suzuki et al.

(10) Patent No.: US 8,717,017 B2
(45) Date of Patent: May 6, 2014

(54) MAGNETIC FIELD DETECTION APPARATUS AND MEASUREMENT APPARATUS

(75) Inventors: Mutsumi Suzuki, Kodaira (JP); Nobuyasu Kanekawa, Hitachi (JP); Masamichi Yamada, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 1114 days.

(21) Appl. No.: 12/708,259

(22) Filed: Feb. 18, 2010

(65) Prior Publication Data

US 2010/0219822 A1  Sep. 2, 2010

(30) Foreign Application Priority Data

Feb. 27, 2009  (JP) ................... 2009-045026

(51) Int. Cl.
  *G01R 33/02* (2006.01)
(52) U.S. Cl.
  USPC .............. 324/252; 324/207.25; 324/207.21
(58) Field of Classification Search
  USPC ................... 324/252, 207.25, 207.21
  See application file for complete search history.

(56) References Cited

U.S. PATENT DOCUMENTS

| | | | |
|---|---|---|---|
| 5,949,051 A | 9/1999 | Kiriyama | |
| 6,100,686 A * | 8/2000 | Van Delden et al. | 324/252 |
| 6,496,002 B1 * | 12/2002 | Kogiso et al. | 324/207.21 |
| 7,171,858 B1 * | 2/2007 | Kanatani et al. | 73/754 |
| 7,562,582 B2 * | 7/2009 | Yoshikawa et al. | 73/777 |
| 2003/0070497 A1 | 4/2003 | Kikuchi et al. | |
| 2003/0194836 A1 * | 10/2003 | Suzuki et al. | 438/123 |
| 2004/0070391 A1 * | 4/2004 | Muszynski | 324/207.22 |
| 2005/0104581 A1 * | 5/2005 | Miyata et al. | 324/207.25 |
| 2005/0206371 A1 | 9/2005 | Tsukamoto et al. | |
| 2006/0053894 A1 * | 3/2006 | Kunda et al. | 73/715 |
| 2006/0082364 A1 | 4/2006 | Kurumado | |
| 2006/0214656 A1 | 9/2006 | Sudo et al. | |
| 2006/0220662 A1 * | 10/2006 | Nakano et al. | 324/693 |
| 2007/0210792 A1 * | 9/2007 | Wakui et al. | 324/252 |
| 2008/0116886 A1 | 5/2008 | Yamada et al. | |
| 2009/0058407 A1 | 3/2009 | Kanekawa et al. | |

FOREIGN PATENT DOCUMENTS

| | | |
|---|---|---|
| JP | 2000-310504 A | 11/2000 |
| JP | 2003-121197 A | 4/2003 |
| JP | 2005-24287 A | 1/2005 |
| JP | 2006-258455 A | 9/2006 |
| JP | 2008-134215 A | 6/2008 |
| JP | 2009-58291 A | 3/2009 |

OTHER PUBLICATIONS

Tanigawa, Hiroshi et al., "MOS Integrated Silicon Pressure Sensor", IEEE Transactions on Electron Devices, Jul. 1985, pp. 1191-1195, vol. ED-32, No. 7, IEEE.
European Search Report dated Oct. 29, 2010 (Three (3) pages).

* cited by examiner

*Primary Examiner* — Huy Q Phan
*Assistant Examiner* — Temilade S Rhodes-Vivour
(74) *Attorney, Agent, or Firm* — Crowell & Moring LLP

(57) ABSTRACT

There has been a problem that a bridge circuit using magneto-resistive elements or transducer elements could output a signal including an offset voltage, which could result in lower measurement accuracy. In order to solve such a problem, half-bridges each having magneto-resistive elements or transducer elements are excited with different excitation voltages so that the offset voltage is eliminated and the measurement accuracy is improved.

18 Claims, 21 Drawing Sheets

MAGNETIC FIELD DETECTION APPARATUS AND MEASUREMENT APPARATUS

BACKGROUND OF THE INVENTION

1. Field of the Invention

The present invention relates to a magnetic field detection apparatus that detects the angle and intensity of a magnetic field using magneto-resistive elements (hereinafter also referred to as MR (magnetoresistive) elements). The present invention also relates to an apparatus for measuring displacement that measures displacement of physical quantity such as displacement of an angle, gradient, or stroke using magneto-resistive elements (hereinafter also referred to as MR (magnetoresistive) elements). Further, the present invention also relates to a measurement apparatus using transducer elements whose resistance changes depending on the ambient physical quantity.

2. Background Art

Such a magnetic field detection apparatus or an apparatus for measuring displacement using MR elements has been known from, for example, Reference 1 (JP Patent Publication (Kokai) No. 2003-121197 A), Reference 2 (JP Patent Publication (Kokai) No. 2005-24287 A), Reference 3 (JP Patent Publication (Kokai) No. 2000-310504 A), and the like.

Among magneto-resistive elements (MR elements), there are known anisotropic magneto-resistive elements (anisotropic magnetoresistance elements; hereinafter referred to as "AMR elements"), giant magneto-resistive elements (giant magnetoresistance elements; hereinafter referred to as "GMR elements"), and the like. Hereinafter, a brief summary of the conventional techniques will be described by way of an example of a magnetic field detection apparatus using GMR elements.

A GMR element has a first magnetic layer (a pinned magnetic layer), a second magnetic layer (a free magnetic layer), and a non-magnetic layer (a spacer layer) sandwiched between the two magnetic layers. When an external magnetic field is applied to the GMR element, the magnetization direction of the pinned magnetic layer does not change and remains pinned, whereas the magnetization direction of the free magnetic layer changes in accordance with the direction of the external magnetic field.

When a voltage is applied between the both terminals of the GMR element, a current corresponding to the resistance of the element flows through the element. The magnitude of the resistance of the element changes depending on the difference $\Delta\theta$ between the magnetization direction $\theta p$ of the pinned magnetic layer and the magnetization direction $\theta f$ of the free magnetic layer ($\Delta\theta = \theta f - \theta p$). Thus, if the magnetization direction $\theta p$ of the pinned magnetic layer is known in advance, it is possible to detect the magnetization direction $\theta f$ of the free magnetic layer, that is, the direction of an external magnetic field by measuring the resistance of the GMR element utilizing such a property.

A mechanism in which the resistance of the GMR element changes depending on $\Delta\theta = \theta f - \theta p$ is described below.

A magnetization direction in a thin-film magnetic film is related to the spin direction of electrons in a magnetic material. Thus, when $\Delta\theta = 0$, the free magnetic layer and the pinned magnetic layer have a high percentage of electrons that spin in the same direction. Conversely, when $\Delta\theta = 180°$, the two magnetic layers have a high percentage of electrons that spin in opposite directions.

FIGS. 3A and 3B each schematically show a cross section of a free magnetic layer 11, a spacer layer 12, and a pinned magnetic layer 13. The arrows in the free magnetic layer 11 and the pinned magnetic layer 13 schematically show the spin directions of the majority of electrons. FIG. 3A shows a case in which $\Delta\theta = 0$, i.e., electrons' spin directions of the free magnetic layer 11 and the pinned magnetic layer 13 are aligned. FIG. 3B shows a case in which $\Delta\theta = 180°$, i.e., electrons' spin directions of the free magnetic layer 11 and the pinned magnetic layer 13 are opposite. When $\theta = 0$ as shown in FIG. 3A, electrons spinning to the right, which have escaped from the pinned magnetic layer 13, are not scattered in the free magnetic layer 11 almost at all because a large number of electrons in the free magnetic layer 11 spin in the same direction. Thus, the electrons follow a trajectory as indicated by an electron trajectory 810. Meanwhile, when $\Delta\theta = 180°$ as shown in FIG. 3B, electrons spinning to the right, which have escaped from the pinned magnetic layer 13, are scattered frequently upon entering the free magnetic layer 11 because the free magnetic layer 11 contains many electrons that are spinning in the opposite direction. Thus, the electrons follow a trajectory as indicated by an electron trajectory 810. As described above, when $\Delta\theta = 180°$, the probability of electron scatterings could increase, which in turn could increase the electrical resistance.

When $\Delta\theta$ is an intermediate value between 0 and 180°, a state between the states of FIGS. 3A and 3B results. The resistance of a GMR element is known to satisfy:

$$R = R_0 + \Delta R(1 - \cos \Delta\theta)/2 \qquad \text{[Formula 1]}$$

$\Delta R/R$ equals several % to several tens of %.

As described above, a current flow through (i.e., electrical resistance of) a GMR element can be controlled with the direction of electrons' spin. Thus, it is also called a spin-valve element.

A magnetic film with a thin film thickness (a thin-film magnetic film) has an extremely large demagnetizing factor in the direction of the normal to the plane. Thus, a magnetization vector cannot rise up in the direction of the normal to the plane (the film thickness direction) and thus remains lying in the plane. Each of the free magnetic layer 11 and the pinned magnetic layer 13 of the GMR element is sufficiently thin. Thus, the magnetization vectors of the two magnetic layers lie in the direction of the plane.

A magnetic field detection apparatus has a Wheatstone bridge constructed from four GMR elements $R_1$ to $R_4$ as shown in FIG. 4. Herein, the magnetization direction of a pinned magnetic layer of each of $R_1$ and $R_3$ is set at zero ($\theta p = 0$), and the magnetization direction of a pinned magnetic layer of each of $R_2$ and $R_4$ is set at 180° ($\theta p = 180°$). The magnetization direction $\theta f$ of a free magnetic layer is determined by an external magnetic field. Thus, all of the magnetization directions $\theta f$ of the free magnetic layers of the four GMR elements are the same, satisfying the following relationship: $\Delta\theta 2 = \theta f - \theta p 2 = \theta f - \theta p 1 - \pi = \Delta\theta 1$. Since $\Delta\theta 1$ is based on $\theta p = 0$, it is assumed that $\Delta\theta 1 = 0$. Thus, as can be seen from Formula 1, $R_1$ and $R_3$ satisfy (n=1, 3):

$$R_n = R_{n0} + \frac{\Delta R}{2}(1 - \cos\theta) \qquad \text{[Formula 2]}$$

In addition, $R_2$ and $R_4$ satisfy (n=2, 4):

$$R_n = R_{n0} + \frac{\Delta R}{2}(1 + \cos\theta) \qquad \text{[Formula 3]}$$

The differential voltage $\Delta v = v_2 - v_1$ between terminals 1 and 2 upon application of an excitation voltage $e_0$ to the bridge circuit of FIG. 4 is given by:

$$\Delta v = \left( \frac{R_1 R_3 - R_2 R_4}{(R_1 + R_4)(R_2 + R_3)} \right) e_0 \qquad \text{[Formula 4]}$$

When Formula 2 and Formula 3 are substituted into Formula 4, and provided that $R_{n0}$ is equal when n=1 to 4, and also provided that $R_0 = R_{n0}$, the following formula is obtained.

$$\Delta v = \frac{-\Delta R \cos \theta}{2R_0 + \Delta R} \qquad \text{[Formula 5]}$$

As described above, since the signal voltage $\Delta v$ is proportional to $\cos \theta$, the direction $\theta$ of a magnetic field can be detected.

According to Formula 5, the signal voltage $\Delta v = 0$ when $\theta = 90°$. That is, $\Delta v = 0$ because the following proportional relationship is satisfied when $\theta = 90°$:

$$\frac{R_1}{R_4} = \frac{R_2}{R_3} \qquad \text{[Formula 6]}$$

In practice, however, there are cases in which $\Delta v = 0$ cannot be satisfied and an offset voltage remains even when $\theta = 90°$. An offset voltage is generated when the proportional relationship of Formula 6 cannot be satisfied, for example, because the electrical resistances of the four GMR elements deviate due to deviation in production quality of the four GMR elements.

Since the angle $\theta$ of a magnetic field is calculated on the assumption that the signal $\Delta v$ is proportional to $\cos \theta$, measurement errors could occur if an offset voltage remains. Further, since an offset voltage changes with temperature in many cases, a change in temperature could also result in a change in measurement errors.

Countermeasures against the aforementioned problem of the generation of the offset voltage have been proposed so far. Such measures are roughly divided into the two following methods. According to the first method, a compensation resistor is built into a Wheatstone bridge, in addition to four GMR elements. This method is disclosed in, for example, JP Patent Publication (Kokai) No. 2000-310504 A (Reference 3) in which the resistance value of the compensation resistor is adjusted to satisfy the proportional relationship of Formula 6 and thus to eliminate an offset voltage. This method, however, has a problem in that since an offset voltage could change with a change in temperature, if the temperature is changed, the proportional relationship of Formula 6 cannot be satisfied, resulting in generation of an offset voltage.

According to the second method, an offset voltage is stored in advance, and the offset voltage is subtracted from a signal voltage for compensation. However, in practice, an offset voltage changes with temperature, and thus it is necessary to measure an offset voltage for each temperature within the range of temperatures to be used, in advance. Thus, a problem is posed that the production and inspection processes of modules as well as the inspection time could increase, which could result in a cost increase. Further, another problem is posed that it is also necessary to provide temperature measurement means for measuring the temperatures of the GMR elements, which could result in a complex module configuration.

SUMMARY OF THE INVENTION

The present invention has been made in order to solve the aforementioned problems. The present invention eliminates an offset voltage generated due to property deviation of magneto-resistive elements (MR elements) that constitute a Wheatstone bridge.

The present invention also eliminates an offset voltage from a signal output of a Wheatstone bridge having transducer elements whose impedance changes in accordance with the physical quantities of the environment.

A brief summary of the representation of the present invention will be described below.

There is provided a magnetic field detection apparatus comprising at least four magneto-resistive elements including first to fourth magneto-resistive elements, a first positive-polarity terminal, a first negative-polarity terminal, a first detection terminal, a second positive-polarity terminal, a second negative-polarity terminal, a second detection terminal, two connections including first and second connections, the first connection being sequentially connected to the first positive-polarity terminal, the first magneto-resistive element, the first detection terminal, the fourth magneto-resistive element, and the first negative-polarity terminal, and the second connection being sequentially connected to the second positive-polarity terminal, the second magneto-resistive element, the second detection terminal, the third magneto-resistive element, and the second negative-polarity terminal, a circuit configured to measure a signal voltage between the first detection terminal and the second detection terminal, a first driving circuit configured to apply a voltage between the first positive-polarity terminal and the first negative-polarity terminal, and a second driving circuit configured to apply a voltage between the second positive-polarity terminal and the second negative-polarity terminal.

There is also provided a measurement apparatus comprising four resistors including first to fourth resistors, at least one of the four resistors is a transducer element whose resistance changes depending on an ambient physical quantity, a first positive-polarity terminal, a first negative-polarity terminal, a first detection terminal, a second positive-polarity terminal, a second negative-polarity terminal, a second detection terminal, two connections including first and second connections, the first connection being sequentially connected to the first positive-polarity terminal, the first resistor, the first detection terminal, the fourth resistor, and the first negative-polarity terminal, and the second connection being sequentially connected to the second positive-polarity terminal, the second resistor, the second detection terminal, the third resistor, and the second negative-polarity terminal, a circuit configured to measure a signal voltage between the first detection terminal and the second detection terminal, a first driving circuit configured to apply a voltage between the first positive-polarity terminal and the first negative-polarity terminal, and a second driving circuit configured to apply a voltage between the second positive-polarity terminal and the second negative-polarity terminal.

There is also provided a measurement apparatus comprising four resistors including first to fourth resistors, at least one of the four resistors is a one transducer element whose resistance changes depending on an ambient physical quantity, a first positive-polarity terminal, a first negative-polarity terminal, a first detection terminal, a second positive-polarity terminal, a second negative-polarity terminal, a second detection terminal, two connections including first and second connections, the first connection being sequentially connected to the first positive-polarity terminal, the first resistor, the first detection terminal, the fourth resistor, and the first negative-polarity terminal, and the second connection being sequentially connected to the second positive-polarity terminal, the second resistor, the second detection terminal, the third resistor, and the second negative-polarity terminal, a circuit configured to measure a signal voltage between the first detection terminal and the second detection terminal, and a first driving circuit configured to apply a voltage between the first positive-polarity terminal and the first negative-polarity terminal, wherein the first driving circuit includes, during operation of the measurement apparatus, a zero-voltage period in which the circuit applies equal potentials to the first positive-polarity terminal and the first negative-polarity terminal, and an excitation period in which the circuit applies different potentials to the first positive-polarity terminal and the first negative-polarity terminal.

As described above, according to the present invention, it is possible to eliminate an offset voltage generated at a signal voltage of a Wheatstone bridge resulting from property deviation of magneto-resistive elements (MR elements). Accordingly, it becomes possible to accurately measure the direction of a magnetic field with a magnetic field detection apparatus having magneto-resistive elements.

It becomes also possible to suppress, even when the ambient temperature of the magnetic field detection apparatus has changed, generation of an offset voltage without measuring the ambient temperature, and thus to accurately measure the direction of a magnetic field.

According to the present invention, it is also possible to eliminate an offset voltage generated at an output signal of a Wheatstone bridge circuit having transducer elements whose impedance changes in accordance with the physical quantities of the environment. Accordingly, it becomes possible to accurately measure the physical quantities of the environment.

Figure 1:
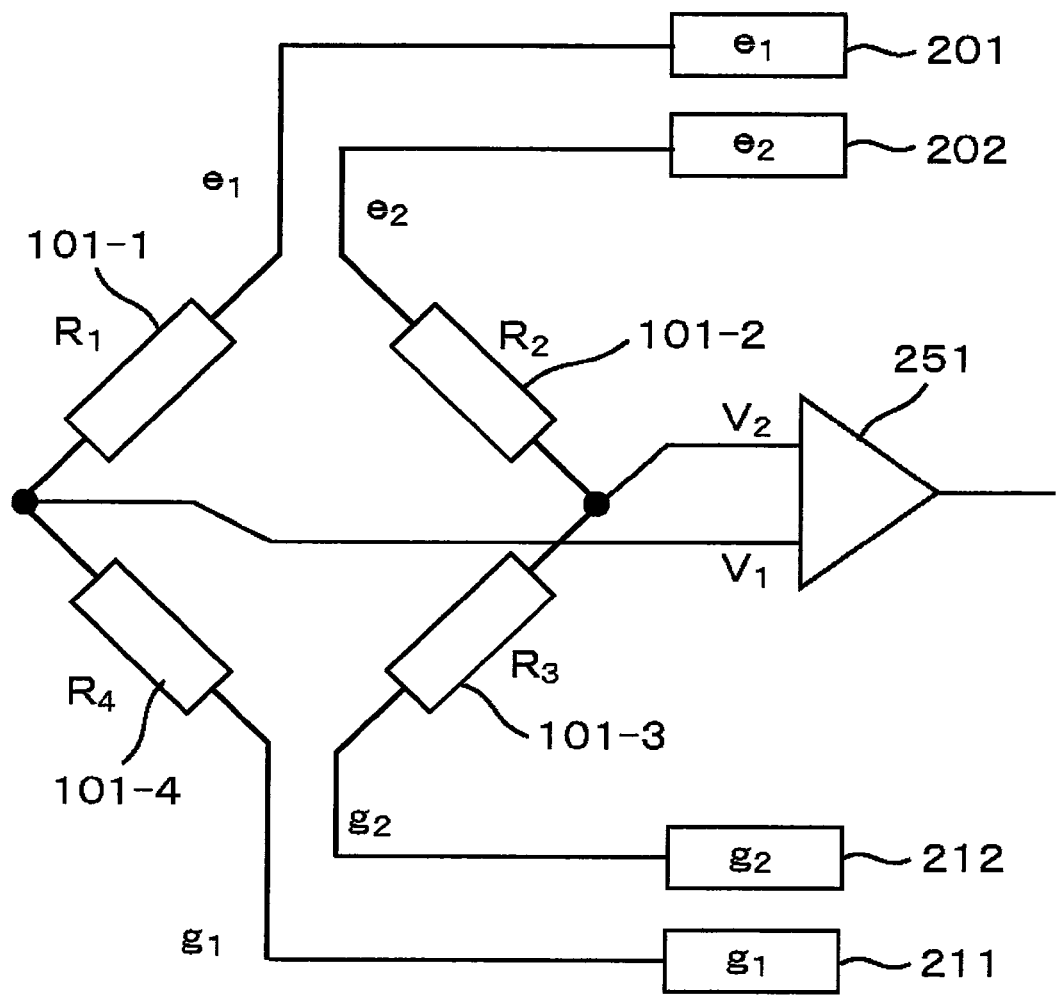
FIG. 1 shows a method of connecting magneto-resistive elements in accordance with the present invention.
Figure 2:
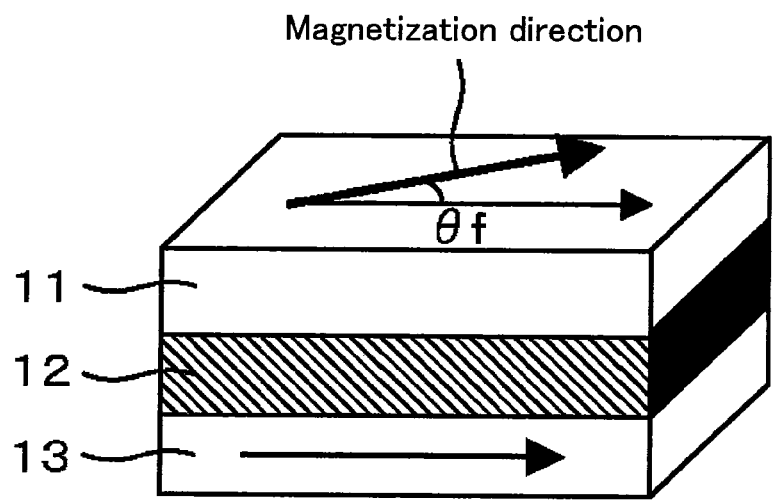
FIG. 2 is a schematic diagram showing the structure of a giant magneto-resistive element.
Figure 3A:
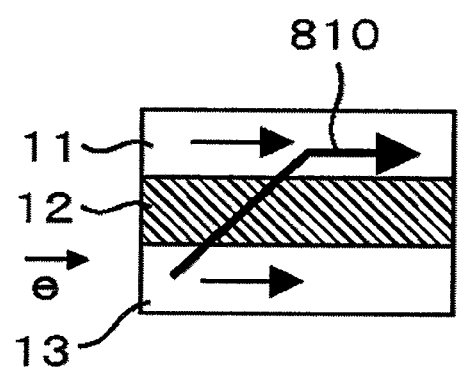
FIGS. 3A and 3B show the operation mechanism of a giant magneto-resistive element.
Figure 3B:
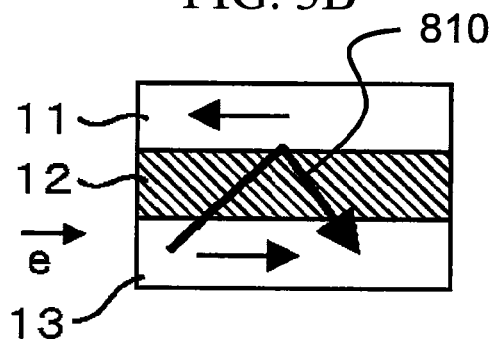

DESCRIPTION OF SYMBOLS 11 free magnetic layer
12 spacer layer
13 pinned magnetic layer
101 magneto-resistive element
121 strain gauge
125 silicon substrate
126 diaphragm
201, 202 positive-polarity driving circuit
211, 212 negative-polarity output circuit
231 magneto-resistive bridge
261 analog-to-digital converter
263 parallel-to-serial converter
271 subtraction-operation unit
273 delay unit
275 sign-changing unit 276 filter unit
278 timing generator
310 atan-conversion block
321 pressure sensor
401 signal processing unit (angle-computing block)
411 magnetic field-detection sensor unit
461, 702 controller
462 wireless transmitter unit
503 supporting unit
504 rotation axis
505 magnet
506 magnetic field
510 stator
520 rotor
511 coil
531 motor
533 current vector control unit
534 current feedback control unit
535 PWM inverter unit
550 tire-pressure measuring apparatus
612 negative-polarity pulse
621 signal-acquisition timing signal
701 rotation angle detection apparatus
711 intake manifold
712 throttle valve
713 throttle shaft
714 gear
715 motor
721 tire
730 vehicle
732 transceiver unit
734 tire-pressure monitoring controller

DETAILED DESCRIPTION OF THE PREFERRED EMBODIMENTS

Hereinafter, embodiments of the present invention will be described in detail by way of example, with reference to the accompanying drawings. First, the first embodiment of a magnetic field detection apparatus in accordance with the present invention will be described with reference to an exemplary magnetic field detection apparatus having giant magneto-resistive elements (GMR elements).

Embodiment 1

FIG. 1 is a schematic diagram showing the configuration of a magnetic field detection apparatus of the first embodiment.

The magnetic field detection apparatus of the present embodiment includes four GMR elements 101-1, 101-2, 101-3, and 101-4. FIG. 1 shows a method of connecting such elements.

A half-bridge having the GMR elements 101-1 and 101-4 is connected to a positive-polarity output circuit $e_1$(201) and a negative-polarity output circuit $g_1$(211). A connection node of the GMR elements 101-1 and 101-4 is a signal terminal $V_1$.

A half-bridge having the GMR elements 101-2 and 101-3 is connected to a positive-polarity output circuit $e_2$(202) and a negative-polarity output circuit $g_2$(212). A connection node of the GMR elements 101-2 and 101-3 is a signal terminal $V_2$.

The signal terminal $V_1$ and the signal terminal $V_2$ are connected to a detection circuit (hereinafter also referred to as a "differential amplifier" or a "differential detector") 251 which detects the differential voltage $\Delta V = V_2 - V_1$ as a signal.

The present invention is characterized in that two different voltages $e_1$ and $e_2$ are supplied to the two half-bridges, as power supply voltages supplied to the bridge circuit having four GMR elements. Such a configuration allows an offset voltage to be eliminated as described below.

As shown in FIG. 1, the resistances of the GMR elements 101-1, 101-2, 101-3, and 101-4 are denoted by $R_1, R_2, R_3,$ and $R_4$, respectively.

The magnetization direction of the pinned magnetic layer 13 of each of the GMR elements $R_1$(101-1) and $R_3$(101-3) is $\theta p=0$. Meanwhile, the magnetization direction of the pinned magnetic layer 13 of each of the GMR elements $R_2$(101-2) and $R_4$(101-4) is $\theta p=180°$. The magnetization direction $\theta f$ of a free magnetic layer is determined by an external magnetic field. Thus, all of the magnetization directions $\theta f$ of the free magnetic layers of the four GMR elements are the same, satisfying the following relationship: $\Delta\theta 2=\theta f-\theta p2=\theta f-\theta p1-\pi=\Delta\theta 1+\pi$. Since $\Delta\theta 1$ is based on $\theta p=0$, it is assumed that $\Delta\theta 1=\theta$. Thus, as can be seen from Formula 1, $R_1$ and $R_3$ satisfy Formula 2 (n=1, 3), and $R_2$ and $R_4$ satisfy Formula 3 (n=2, 4).

The differential voltage $\Delta v = v_2 - v_1$ between the terminals 1 and 2 of the bridge circuit of FIG. 1 is given by:

$$\Delta v = \frac{e_2 R_1 R_3 - e_1 R_2 R_4 + R_3 R_4 (e_2 - e_1)}{(R_1 + R_4)(R_2 + R_3)} \quad \text{[Formula 7]}$$

$$= \frac{e_2 R_1 R_3 - e_1 R_2 R_4}{(R_1 + R_4)(R_2 + R_3)} + \frac{R_3 R_4 (e_2 - e_1)}{(R_1 + R_4)(R_2 + R_3)} \quad \text{[Formula 8]}$$

Hereinafter, the aforementioned concept is extended to cases other than the case of GMR elements, and the following typical case is considered: a pair of $R_1$ and $R_3$ of the bridge circuit facing each other changes as follows (n=1, 3):

$$R_n = R_{n0} + \Delta R \quad \text{[Formula 9]}$$

Likewise, a case in which the other pair $R_2$ and $R_4$ facing each other changes as follows (n=2, 4) is considered:

$$R_n = R_{n0} - \Delta R \quad \text{[Formula 10]}$$

When the case of the GMR elements is considered as a specific example, the value of resistance when the direction of a magnetic field is $\theta=90°$ corresponds to $R_{n0}$. This is obvious when Formulas 2 and 3 are compared with Formulas 9 and 10.

First, the differential voltage $\Delta v$ between the terminals 1 and 2 ($\Delta v = v_2 - v_1$) of the bridge circuit of FIG. 1 when $\Delta R=0$ is determined as follows from Formula 8:

$$\Delta v = \frac{e_2 R_{10} R_{30} - e_1 R_{20} R_{40} + R_{30} R_{40}(e_2 - e_1)}{(R_{10} + R_{40})(R_{20} + R_{30})} \quad \text{[Formula 11]}$$

$$= \frac{e_2 R_{10} R_{30} - e_1 R_{20} R_{40}}{(R_{10} + R_{40})(R_{20} + R_{30})} +$$

$$\frac{R_{30} R_{40}(e_2 - e_1)}{(R_{10} + R_{40})(R_{20} + R_{30})}$$

$$\equiv \Delta v_0$$

Since the differential voltage $\Delta v$ described by Formula 11 indicates a value when $\Delta R=0$, it is defined as $\Delta v_0$. Next, the differential voltage $\Delta v$ when $\Delta R \neq 0$ is determined as follows:

$$\Delta v = \frac{e_2 R_{10} R_{30} - e_1 R_{20} R_{40} + R_{30} R_{40}(e_2 - e_1)}{(R_1 + R_4)(R_2 + R_3)} + C\Delta R \quad \text{[Formula 12]}$$

$$C = \frac{e_2(R_{10} + R_{30}) + e_1(R_{20} + R_{40}) + (R_{40} - R_{30})(e_2 - e_1)}{(R_1 + R_4)(R_2 + R_3)} \quad \text{[Formula 13]}$$

The numerator of the first term of Formula 12 is equal to the numerator of Formula 11. Thus, provided that $\Delta v_0 = 0$, the following proportional relationship can be obtained with Formula 12 even when $\Delta R \neq 0$:

$$\Delta v = C \Delta R \quad \text{[Formula 14]}$$

Herein, the proportionality coefficient C is given by Formula 13.

Consequently, by adjusting the voltage difference $(e_2-e_1)$ to set $\Delta v_0$ defined by Formula 11 to zero, it is possible to eliminate an offset voltage from the signal voltage $\Delta v$ of the bridge circuit shown in FIG. 1 and realize the desirable characteristics such that $\Delta v$ is proportional to the variable $\Delta R$.

In the present invention, it is essential that the excitation voltages $e_1$ and $e_2$ applied to a pair of half-bridge circuits be individually adjustable. In order to clarify such a point, the difference between the present invention and the conventional techniques will be described below.

Figure 4:
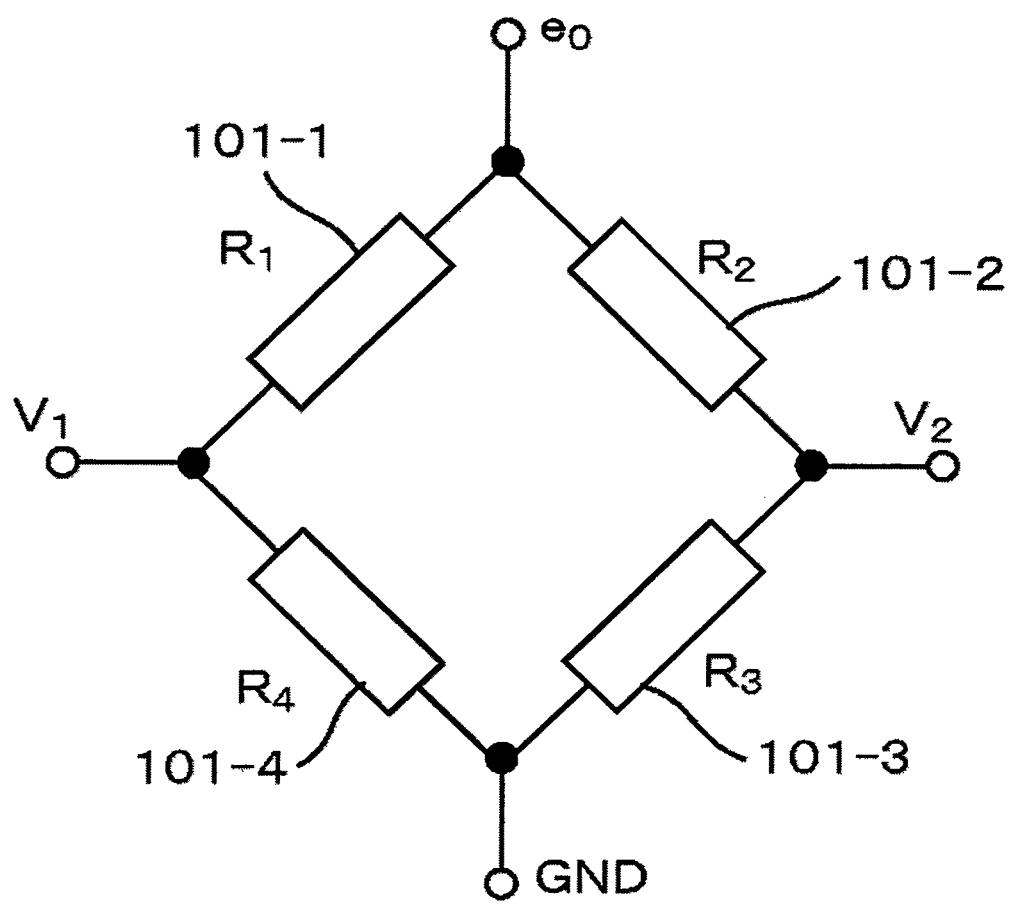
FIG. 4 shows a method of connecting magneto-resistive elements of a conventional magnetic field detection apparatus.

As has been previously described with reference to the problems of the conventional techniques, the conventional configuration (FIG. 4) cannot satisfy Formula 6 even when $\theta = 90°$ due to property deviation of the four GMR elements and the like, and thus the numerator of Formula 4 cannot be zero. That is, an offset voltage remains in the signal voltage $\Delta v$. Attention is now shifted to Formula 11. When an ideal bridge that satisfies the relationship of Formula 6 is used, each of the first term and the second term of Formula 11 becomes zero when $e_1 = e_2$. However, when Formula 6 cannot be satisfied due to property deviation of elements and the like, the first term of Formula 11 does not become zero under the condition $e_1 = e_2$, and an offset voltage is generated. In contrast, in the present embodiment, as can be seen from Formula 11, $\Delta v_0$ can be set to zero when $\theta = 90°$ by adjusting the voltage difference $(e_2-e_1)$. Accordingly, an offset voltage can be eliminated as described above.

Next, the temperature characteristics of the present invention with the configuration of FIG. 1 will be discussed.

The temperature characteristics of the resistance of a material are expressed as follows:

$$R(T) = R(T_0)\{1 + a(T-T_0)\} = R(T_0)(1+a\Delta T) \quad \text{[Formula 15]}$$

When Formula 12 is rearranged by substituting Formula 15 into the numerator of the first term of Formula 12, the result becomes $(1+a\Delta T)$ times as large. Thus, if $\Delta v_0$ is set to zero $(\Delta v_0=0)$ at a certain temperature, relation $\Delta v_0=0$ is satisfied at any given temperature.

Consequently, according to the present invention, when the voltage difference $(e_2-e_1)$ is adjusted such that $\Delta v_0=0$ is satisfied at a certain temperature, for example, at room temperature, $\Delta v_0=0$ can be satisfied at any given temperature, whereby the proportional relationship of Formula 14 is obtained. That is, a signal without an offset voltage can be realized over a wide range of temperature.

As described above, according to the present invention, adjustment in the inspection and compensation processes of a magnetic field detection apparatus after the production process can be carried out at a single temperature, for example, at room temperature. Thus, the process time of the inspection and compensation processes can be significantly reduced.

Next, a magnetic field detection apparatus using GMR elements is considered. $R_1$ and $R_3$ are given as follows from Formula 2:

$$R_n = \left(R_{n0} + \frac{\Delta R}{2}\right) - \frac{\Delta R}{2}\cos\theta \quad \text{[Formula 16]}$$

When Formula 16 is compared with Formula 9, a differential voltage signal when GMR elements are used is given by:

$$\Delta v = -\frac{C\Delta R}{2}\cos\theta \quad \text{[Formula 17]}$$

That is, a signal proportional to the cosine of the direction $\theta$ of a magnetic field is obtained. Such a signal is indicated by $\Delta v(\cos)$.

The constant C corresponds to Formula 13 in which $R_{n0}$ is substituted with $(R_{n0}+\Delta R/2)$.

Next, a bridge with a configuration similar to that of FIG. 1 is constructed using four different GMR elements. It should be noted here that the magnetization direction of a pinned magnetic layer of each of $R_1$ and $R_3$ is $\theta p=90°$, and the magnetization direction of a pinned magnetic layer of each of $R_2$ and $R_4$ is $\theta p=270°$. The magnetization direction $\theta f$ of a free magnetic layer is determined by an external magnetic field. Thus, all of the magnetization directions $\theta f$ of the free magnetic layers of the four GMR elements are the same. Thus, $R_1$ and $R_3$ have $\Delta\theta=\theta f-\pi/2$. Substituting this formula into Formula 2 to Formula 5 yields the following result:

$$R_n = \left(R_{n0} + \frac{\Delta R}{2}\right) - \frac{\Delta R}{2}\sin\theta \quad (n = 1, 3) \quad \text{[Formula 18]}$$

$$R_n = \left(R_{n0} + \frac{\Delta R}{2}\right) + \frac{\Delta R}{2}\sin\theta \quad (n = 2, 4)$$

Thus, the differential voltage $\Delta = v_2-v_1$ between the terminals 1 and 2 is given by:

$$\Delta v = -\frac{C\Delta R}{2}\sin\theta \quad \text{[Fountain 19]}$$

That is, a signal proportional to the sine of the direction $\theta$ of a magnetic field is obtained. Such a signal is indicated by $\Delta v(\sin)$.

Combining the signals $\Delta v(\cos)$ and $\Delta v(\sin)$ obtained by the two bridge circuits yields the following formula:

$$\frac{\Delta v(\sin)}{\Delta v(\cos)} = \frac{\sin\theta}{\cos\theta} = \tan\theta \quad \text{[Formula 20]}$$

When the signals from the two Wheatstone bridges are combined as described above, the constant C of proportionality and $\Delta R$ cancel each other out. Thus, the direction $\theta$ of a magnetic field can be accurately determined even when C and $\Delta R$ have changed due to the temperature dependence of resistance and the like.

In the conventional method, each of the $\Delta v(\cos)$ and $\Delta v(\sin)$ signals includes an offset voltage. Thus, even when they are divided, the proportionality constant cannot be cancelled out completely, and thus errors could occur. In contrast, in the present invention, each of the $\Delta v(\cos)$ and $\Delta v(\sin)$ signals does not include an offset voltage. Thus, the angle of a magnetic field can be accurately determined through the processing of Formula 20.

Figure 5:
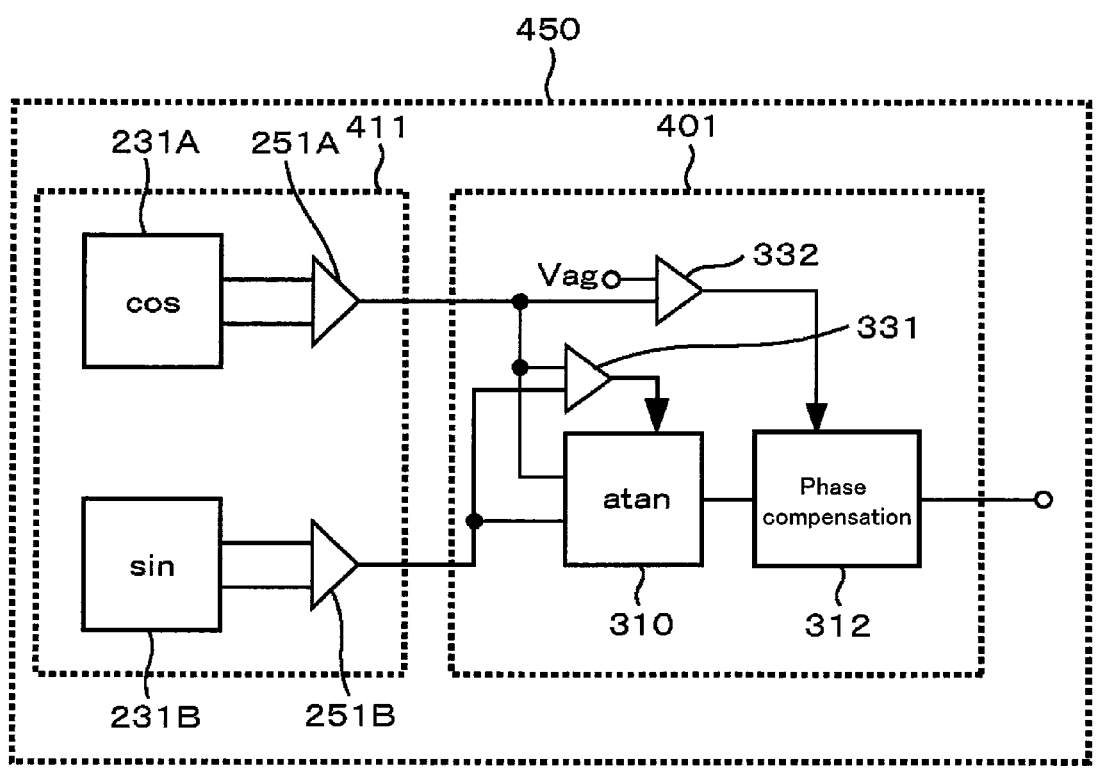
FIG. 5 shows the configuration of a magnetic field detection apparatus in accordance with an embodiment of the present invention.

FIG. 5 is a block diagram showing the configuration of a magnetic field detection apparatus 450 of the present embodiment. The magnetic field detection apparatus 450 includes a magnetic field-detection sensor unit 411 and a signal processing unit (hereinafter also referred to as an "angle-computing block") 401. The positive-polarity driving circuits 201 and 202 and the negative-polarity output circuits 211 and 212 are not shown in FIG. 5; these circuits can be disposed in either of the magnetic field-detection sensor unit 411 or the signal processing unit 401. The signal processing unit 401 is a circuit that calculates the angle θ of a magnetic field. One example of the configuration of such circuit is shown in FIG. 5.

A differential amplifier 251A connected to a COS bridge outputs a differential signal Δv(cos). A differential amplifier 251B connected to a SIN bridge outputs a differential signal Δv(sin). These output signals are inputted to the angle-computing block 401. The angle-computing block 401 calculates and outputs the direction (angle) θ of a magnetic field based on such input signals.

The angle-computing block 401 includes an atan-conversion block 310, a phase-compensation block 312, and two comparators 331 and 332.

As seen from Formula 20, calculating ArcTan [Δv(sin)/Δv(cos)] can determine the angle θ of a magnetic field. This, however, poses two problems: (a) first of all, since the ArcTan( ) function can determine only the range of −90° to 90°, it is impossible to determine all directions of 360°, and (b) secondly, when Δv(cos) has decreased, the influence of an error of Δv(cos) could increase, which in turn could decrease the accuracy of θ. In order to solve such problems, the angle-computing block 401 of FIG. 5 uses the comparators 331 and 332.

In order to address the problem (b), the atan-conversion block 310 determines the angle θ by the following method. The comparator 331 determines the magnitude relationship between the absolute values of Δv(cos) and Δv(sin). When |Δv(cos)| is greater than |Δv(sin)|, the angle θ is determined by:

$$\theta = \text{ArcTan}\left(\frac{\Delta v(\sin)}{\Delta v(\cos)}\right) \quad \text{[Formula 21]}$$

Conversely, when |Δv(cos)| is smaller than |Δv(sin)|, the angle θ is determined by:

$$\theta = \text{ArcCot}\left(\frac{\Delta v(\cos)}{\Delta v(\sin)}\right) \quad \text{[Formula 22]}$$

Accordingly, expansion of computation errors caused by a decrease of denominator can be avoided.

The problem (a) is addressed by the following method. The comparator 332 determines if Δv(cos) is a positive value or a negative value. If Δv(cos) is determined to be a positive value, the phase-compensation block 312 outputs the angle θ as it is. Meanwhile, if Δv(cos) is determined to be a negative value, the phase-compensation block 312 outputs a sum of the angle θ and 180° (θ+)180°. Accordingly, the phase-compensation block outputs the direction/angle θ of a magnetic field in the range of −90° to +270°, and thus is capable of detecting all directions of 360°.

In this method, it is important that if the Δv(cos) signal is a positive value or a negative value be determined accurately. Conventionally, it has been impossible to accurately determine if Δv(cos) is a positive value or a negative value since an offset voltage has not been eliminated from Δv(cos). As a result, a large error has occurred at an angle at the vicinity of Δv(cos)=0. Meanwhile, in the present invention, accurate phase compensation is possible because an offset voltage is eliminated from Δv(cos).

Figure 24:
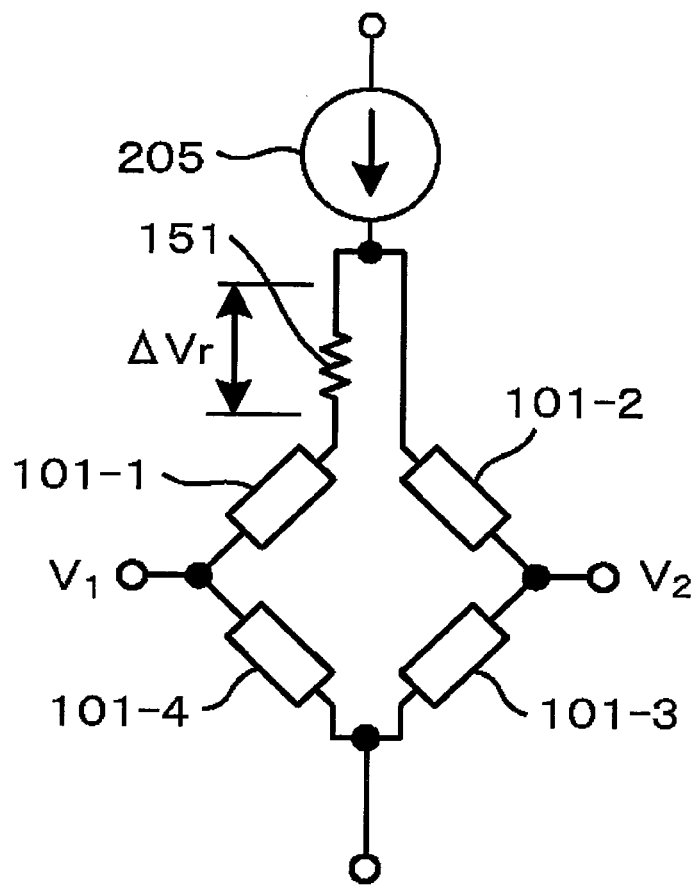
FIG. 24 shows an example of a conventional bridge of magneto-resistive elements.

FIG. 24 shows a known method of compensating for an offset voltage of a bridge circuit, using a combination of a compensation resistor 151 and a constant current source 205. In this method, since the resistance of the compensation resistor 151a changes with a change in ambient temperature due to the temperature characteristics, the voltage ΔVr across the compensation resistor also changes with the temperature. Therefore, even when an offset voltage is compensated at a certain temperature with the compensation resistor 151, compensation of the offset voltage becomes impossible when the ambient temperature has changed. In contrast, in the present invention, since the voltage difference ($e_2-e_1$) remains constant even when the ambient temperature has changed, an offset voltage can be accurately compensated even when the temperature has changed as described above. That is, since an offset voltage is not generated even when the temperature has changed, the angle θ of a magnetic field can be accurately determined.

Embodiment 2

A rotation angle detection apparatus will now be described as a second embodiment of the present invention.

Figure 6:
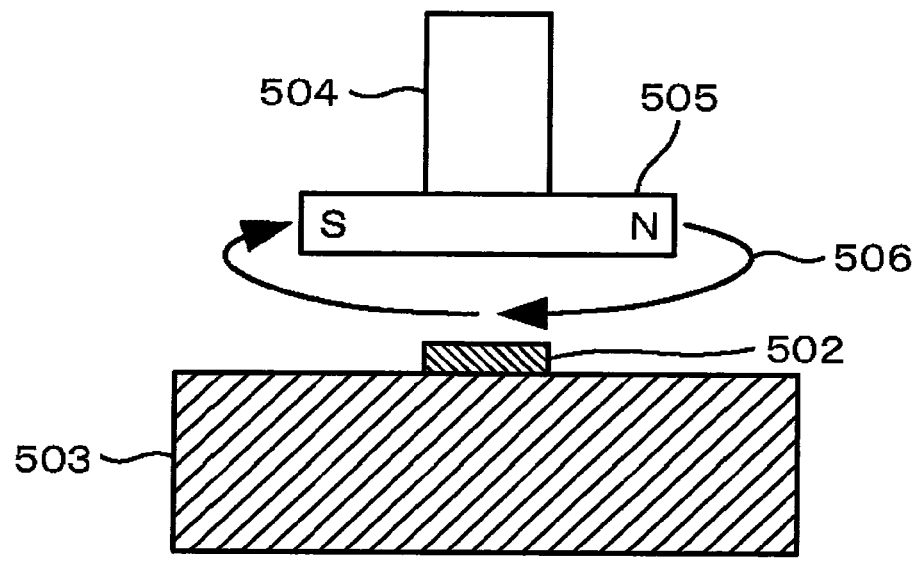
FIG. 6 shows a rotation angle detection apparatus in accordance with an embodiment of the present invention.

FIG. 6 is a schematic diagram showing the structure of the second embodiment of the present invention. A stator unit includes a flat-plate supporting unit 503 made of a non-magnetic material and a magnetic field detection apparatus 502 disposed on the upper surface of the supporting unit.

A rotor unit includes a rotation axis 504 made of a non-magnetic material and a magnet 505 integrally secured to the rotation axis. The rotation axis is rotatably supported by a stationary case (not shown) such that it faces the stator unit with a predetermined gap therebetween. The magnet 505 is a disk-shaped magnet made of ferrite or the like, and has an N pole and a S pole that are magnetized so as to form a uniform magnetic field 506 above the magnetic field detection apparatus 502 of the stator unit.

For the magnetic field detection apparatus 502, a magnetic field detection apparatus 502 with GMR elements described in Embodiment 1 is used.

In this structure, the direction θ of the magnetic field 506 changes with the rotation angle of the rotation axis 504. Thus, since the magnetic field detection apparatus 502 detects the direction θ of the magnetic field as described in Embodiment 1, measurement of the rotation angle of the rotation axis 504 is possible. In this manner, the rotation angle detection apparatus is constructed.

The angle-computing block 401 described in Embodiment 1 computes the rotation angle θ across all directions.

Embodiment 3

A rotation angle detection apparatus will now be described as the third embodiment of the present invention.

In the present embodiment, the rotation angle is detected using only a COS bridge. Although the structure of the present embodiment is similar to that shown in FIG. 6, the magnetic field detection apparatus 502 of FIG. 6 includes only a COS bridge. The COS bridge has the configuration described in Embodiment 1.

Figure 7:
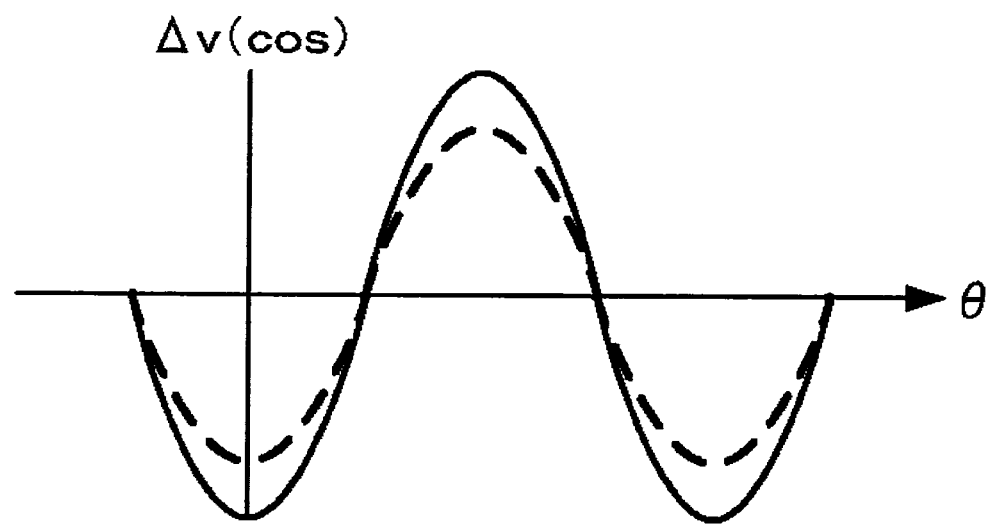
FIG. 7 illustrates a detection method in accordance with an embodiment of the present invention.

FIG. 7 schematically shows a view in which the output signal Δv(cos) of the COS bridge of the magnetic field detection apparatus 502 changes with the rotation angle θ. As seen from Formula 17, the Δv(cos) signal is proportional to cos θ, as depicted with the solid line in FIG. 7. A waveform of the dotted line in FIG. 7 schematically shows the waveform of an output signal at a different temperature. Although a signal proportional to cos θ is obtained, the amplitude differs. This is because the constant C of proportionality of Formula 17 changes with temperature.

In the present embodiment, the time when θ=90° and 270° is detected by inputting the Δv(cos) signal into a zero-crossing detection circuit. Accordingly, the rotation speed of the rotation axis 504 is detected.

Conventional techniques have a problem in that an accurate rotational position cannot be determined with a zero-crossing detection method since the output of the bridge circuit includes an offset voltage. Meanwhile, in the present embodiment, an accurate rotational position can be detected by zero-crossing detection since an offset voltage of the Δv(cos) signal is eliminated by using the configuration of FIG. 1 for the COS bridge.

Embodiment 4

Figure 8A:
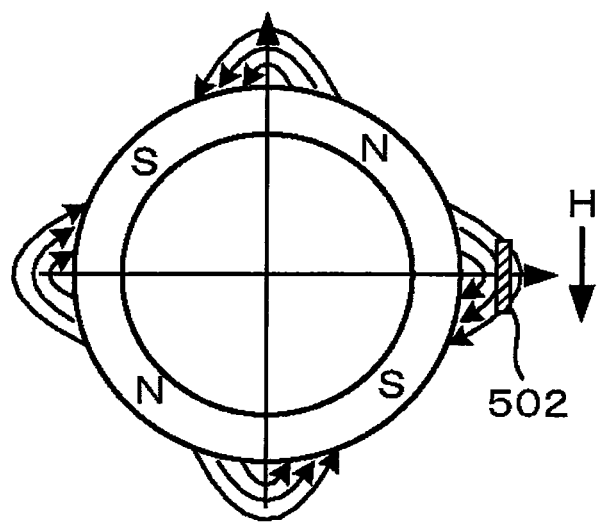
FIGS. 8A and 8B illustrate detection of the rotation angle of a multi-pole magnet in accordance with an embodiment of the present invention.
Figure 8B:
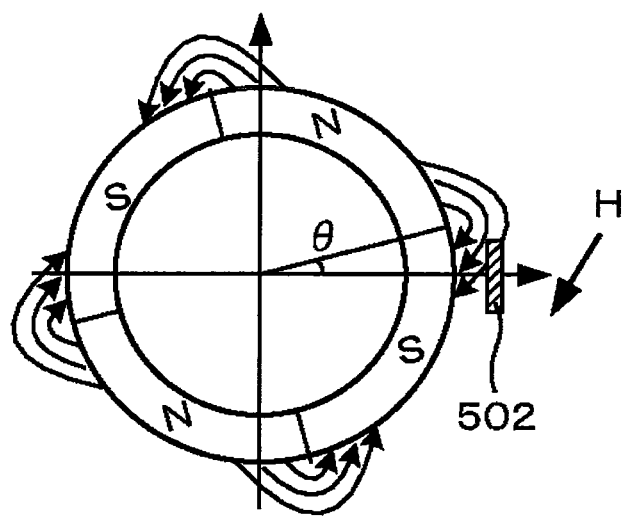

The fourth embodiment of the present invention will describe an example in which the rotation angle of a magnet is detected by disposing the magnetic field detection apparatus of the first embodiment at a side of the magnet. The present embodiment illustrates an example in which a multi-pole magnet is used for the rotor. A multi-pole magnet is a magnet with multiple magnetized poles. The present embodiment will describe the structure of a four-pole magnet as an example. FIG. 8 schematically shows a magnetic field formed around a four-pole magnet.

Magnetic flux lines from the N pole to the S pole leak to the outside of the magnet, forming a magnetic field. As seen from FIG. 8, the direction of a leakage magnetic flux correlates with the rotation angle θ of the multi-pole magnet. Thus, the rotation angle θ of the multi-pole magnet can be determined by disposing the magnetic field detection apparatus of Embodiment 1 at a side of the multi-pole magnet as shown in FIG. 8 and measuring the direction of a magnetic field with the magnetic field detection apparatus, using the method described in Embodiment 1.

Embodiment 5

As the fifth embodiment of the present invention, a brushless motor with a rotor provided with a permanent magnet will be described.

Figure 9:
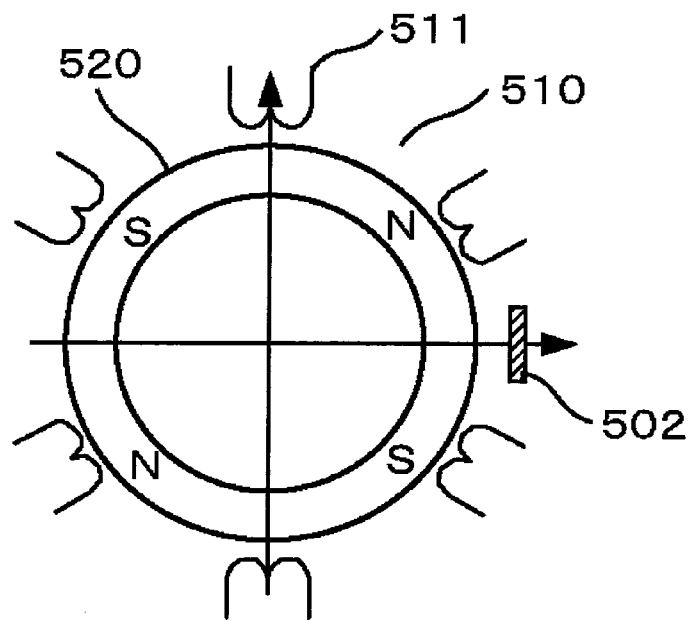
FIG. 9 is a schematic diagram showing a brushless motor in accordance with an embodiment of the present invention.

FIG. 9 is a view of the brushless motor of the present embodiment, in which only a stator 510 and a rotor 520 are extracted for illustration. A multi-pole magnet is provided on the rotor 520. FIG. 9 shows an example of a four-pole magnet. In the stator 510, a coil 511 and the magnetic field detection apparatus 502 are disposed. The coil 511 is a three-phase coil having a U-phase, V-phase, and W-phase. Feeding an appropriate amount of current through each phase of the three-phase coil in accordance with the rotation angle θ of the rotor 520 will give a driving force to the rotor, thereby causing the motor to efficiently rotate.

The rotation angle θ of the rotor can be determined by detecting the direction of a leakage magnetic flux from the multi-pole magnet of the rotor with the magnetic field detection apparatus 502, as described previously.

Figure 10:
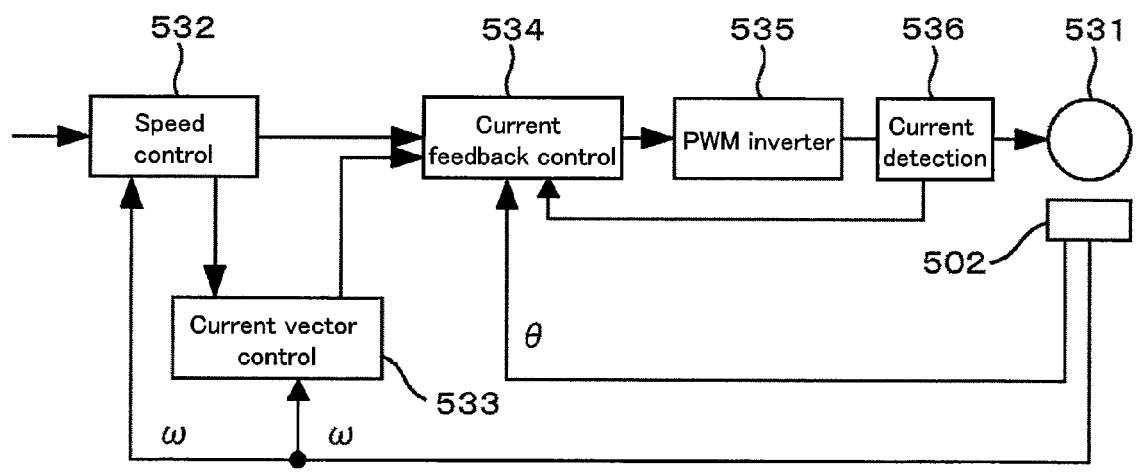
FIG. 10 shows a control circuit of a brushless motor in accordance with an embodiment of the present invention.

FIG. 10 is a block diagram showing a configuration for controlling a current fed to the coil 511. In the present embodiment, a current is controlled through the current vector control method based on the d-q transformation. Upon input of a command value of the rotation angular speed ω into a speed control unit 532, a current vector control unit 533 calculates the value of the necessary current to be fed on the d-q reference frame by comparing the input rotation angular speed ω with the measured angular speed ω. A current feedback control unit 534 calculates the amounts of currents iU, iV, and iW to be fed to the U-, V-, and W-phases, respectively, based on the calculated values of currents (id and iq), the actual rotation angle θ of the rotor, and the measured values of currents fed to the U- and V-phases; and then, the current feedback control unit 534 input the calculated values of iU, iV, and iW to a PWM inverter unit 535. Currents generated by the PWM inverter unit 535 are supplied to the coil of the motor 531, and make the motor operate.

According to the present embodiment, using the configuration of the present invention for the magnetic field detection apparatus 502 allows accurate determination of the rotation angle θ and the angle speed ω of the rotor over a wide range of temperature. Since a current fed to the brushless motor of the present embodiment can be controlled with high accuracy, it is possible to operate the brushless motor over a wide range of temperature with high efficiency.

Embodiment 6

Next, another embodiment of the present invention will be described with reference to FIG. 11.

In the present embodiment, a magnetic field is detected with high accuracy by eliminating an offset voltage resulting from a detection circuit.

Figure 11:
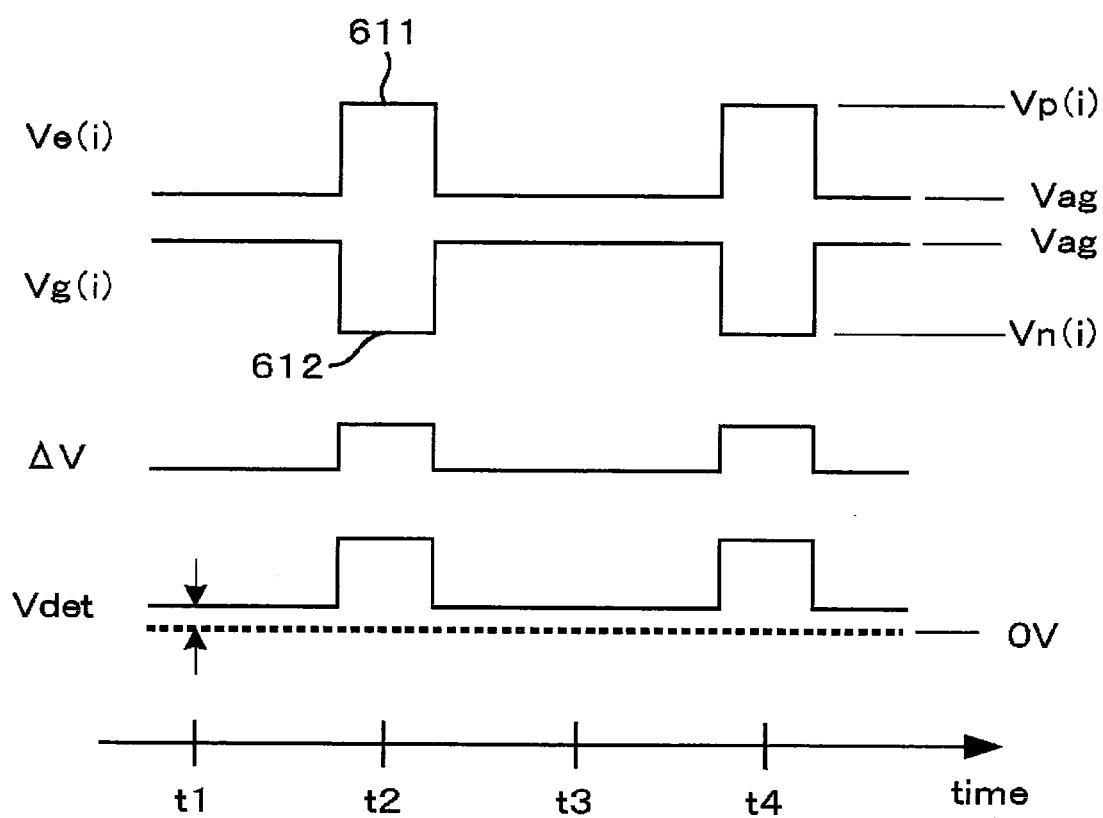
FIG. 11 shows waveforms of excitation voltages in a magnetic field detection apparatus in accordance with an embodiment of the present invention.

FIG. 11 shows the waveforms of excitation voltages applied to the half-bridges of the GMR elements with the configuration shown in FIG. 1. The waveforms of excitation voltages applied to the terminals $e_1$ and $e_2$ in FIG. 1 are indicated by Ve(1) and Ve(2), respectively, and the waveforms of excitation voltages applied to the terminals $g_1$ and $g_2$ are indicated by Vg(1) and Vg(2), respectively. FIG. 11 also shows the differential voltage signal $\Delta v = V_2 - V_1$ at that time. In FIG. 11, suffix "i" means "1" or "2".

At time $t_1$, a reference voltage Vag is applied to both of the terminals Ve(i) and Vg(i) (i=1, 2). That is, since the positive-polarity terminal $e_1$ and the negative-polarity terminal $g_1$ of the bridge circuit are at the same potential Vag, the signal voltages of the terminals $V_1$ and $V_2$ are both at Vag. Thus, the differential voltage signal $\Delta v = V_2 - V_1$ is zero.

Thus, a voltage Vdet($t_1$), which represents the output voltage Vdet(t) of the detection circuit 251 at the time $t_1$, is an offset voltage resulting from the detection circuit 251. At time $t_2$, the positive-polarity driving circuit 201 outputs a positive-polarity pulse 611, and the negative-polarity output circuit 211 outputs a negative-polarity pulse 612. Accordingly, a signal voltage corresponding to the direction of a magnetic field is generated in the differential voltage signal $\Delta v = V_2 - V_1$.

The difference signal between the signals at the time $t_2$ and the time $t_1$ ($\Delta$Vdet=Vdet($t_2$)−Vdet($t_1$)) corresponds to a signal obtained by removing an offset voltage resulting from the detection circuit 251 from the signal voltage. In this manner, an offset voltage resulting from the detection circuit can be eliminated, enabling high-accuracy detection of a magnetic field.

Likewise, $\Delta$Vdet=Vdet($t_4$)−Vdet($t_3$) represents a signal voltage at time $t_4$.

As described above, in the present embodiment, it is essential that the four terminals $e_1$, $e_2$, $g_1$, and $g_2$ of the bridge circuit shown in FIG. 1 be set at the same voltage (Vag in FIG. 11), and the voltage $Vsig(t_1)$ of the detection circuit at this time be subtracted as the reference signal. Accordingly, it is possible to accurately separate an offset voltage resulting from the GMR elements from an offset voltage resulting from the detection circuit.

In the present embodiment, the reference signal $Vdet(t_1)$ is measured first, which is followed by determination of the signal voltage $Vdet(t_2)$ when the GMR elements are excited, and then the signal voltage $\Delta Vdet=Vdet(t_2) - Vdet(t_1)$ is determined. According to such order, it is possible to minimize the time lag between the output signal at the signal measurement (sampling) and the output signal after the signal processing. This can be an important configuration for, in particular, a magnetic field detection circuit that is demanded to have high-speed response properties in measurement of the rotation angle of a motor, for example.

In the present embodiment, the GMR elements are excited to allow a current flow therethrough only in the period in which the positive-polarity pulse 611 and the negative-polarity pulse 612 are applied. Thus, a magnetic field detection apparatus with low power consumption can be realized.

Since power consumed by the GMR elements can be reduced in the present embodiment, the following advantages can be provided: heat generation (the Joule heating) of the GMR elements when a current is allowed to flow therethrough is reduced, and a change in property of the GMR elements due to a temperature rise can be suppressed.

In addition, in the present embodiment, the voltage amplitude of the positive-polarity pulse 611 and that of the negative-polarity pulse 612 are set roughly at equal values. Accordingly, the voltage values of the signal voltages $V_1$ and $V_2$ will not change greatly from the time when the zero-level is detected (the time $t_1$ in FIG. 11) to the time when the signal is detected (the time $t_2$). Thus, an advantage can be provided in that the required performance of the common-mode rejection ratio CMRR of the differential detector 251 can be small.

Embodiment 7

An apparatus for controlling an electronically controlled throttle valve, which controls the intake air volume of an automotive engine, will be described as another embodiment using the present invention, with reference to FIG. 12.

An intake manifold 711 of an engine has a throttle valve 712 fixed thereto. The degree of opening of the valve is controlled to control the intake volume of air to flow through the manifold, so that the engine is kept in optimum conditions. The throttle valve 712 rotates with the throttle shaft 713 as the axis of rotation. The throttle shaft is connected to a motor 715 via a gear 714, and the motor 715 causes the valve to open and close. The throttle shaft 713 is also connected to a rotation angle detection apparatus 701. The rotation angle detection apparatus 701 includes a magnet (not shown) provided on the throttle shaft and the magnetic field detection apparatus 450 (not shown). By measuring the direction of a magnetic field generated by the magnet with the magnetic field detection apparatus 450, the rotation angle of the throttle shaft 713 is measured. As seen from FIG. 12, the rotation angle of the throttle shaft 713 corresponds to the degree of opening of the throttle valve 712. Information on the thus measured rotation angle (the degree of opening of the valve) is transmitted to a controller 702. Then, the controller 702 calculates, based on a combination of the information on the engine conditions and the information on the accelerator pedal, the optimum degree of opening of the throttle valve, and controls the motor current to thereby set the degree of opening of the valve at optimum conditions.

According to the present invention, accurate measurement of the rotation angle is possible. Thus, accurate control of the throttle valve 712 is possible.

Figure 12:
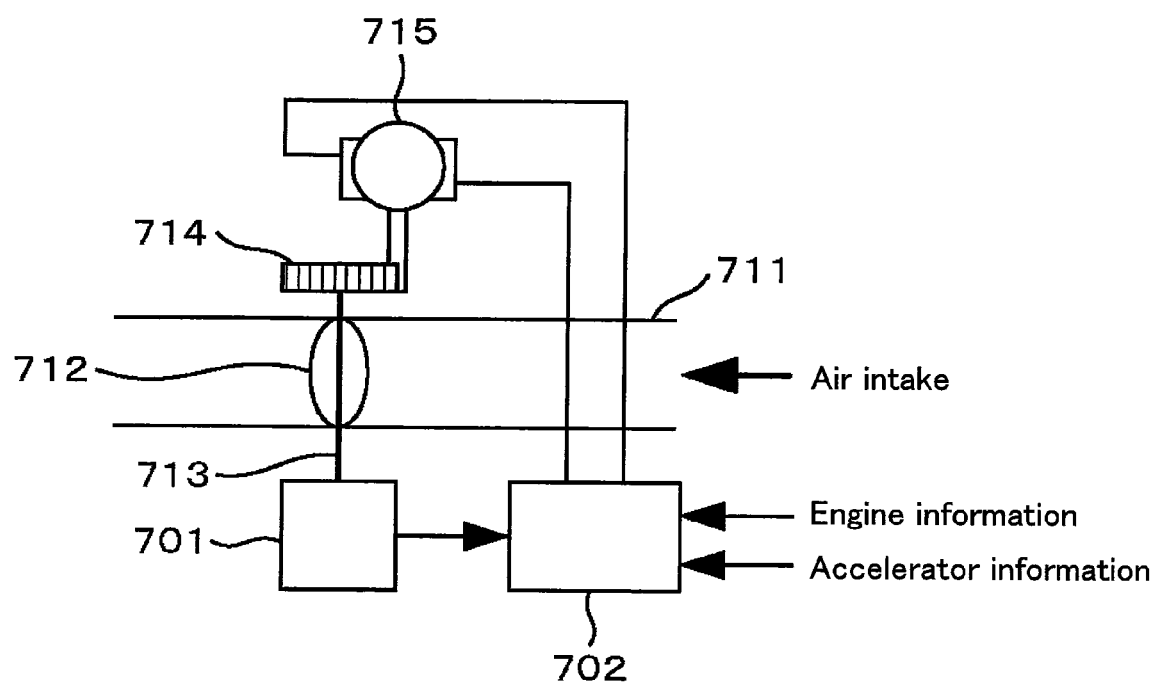
FIG. 12 shows a throttle valve control apparatus in accordance with an embodiment of the present invention.

Although FIG. 12 shows a configuration in which the magnetic field detection apparatus 450 and the controller 702 are separately provided, it is also possible to incorporate the control function of the controller shown in FIG. 12 into the angle-computing block 401 (FIG. 5) of the magnetic field detection apparatus. An exemplary configuration of the angle-computing block 401 is shown in FIG. 5. Incorporating the controller function into the magnetic field detection apparatus in this manner allows a reduction in the number of ICs, whereby a low-cost electronically controlled throttle valve can be constructed.

It is also possible to dispose the magnetic field-detection sensor unit 411 of the magnetic field detection apparatus 450 in the position of the rotation angle detection apparatus 701 of FIG. 12, and dispose the signal processing unit 401 in the vicinity of the controller 702 or incorporate the signal processing unit 401 into the controller 702. When the signal processing unit 401 is spatially separated from the magnetic field-detection sensor unit 411 in this manner, the signal processing unit 401 can be kept away from the high-temperature environment, i.e., the vicinity of the engine. Thus, a high-performance LSI circuit can be advantageously used for the signal processing unit. A specific configuration method for spatially separating the magnetic field-detection sensor unit 411 and the signal processing unit 401 will be described below.

Embodiment 8

Another embodiment of a magnetic field detection apparatus using the present invention will be described with reference to FIGS. 17, 18, and 19.

Figure 17:
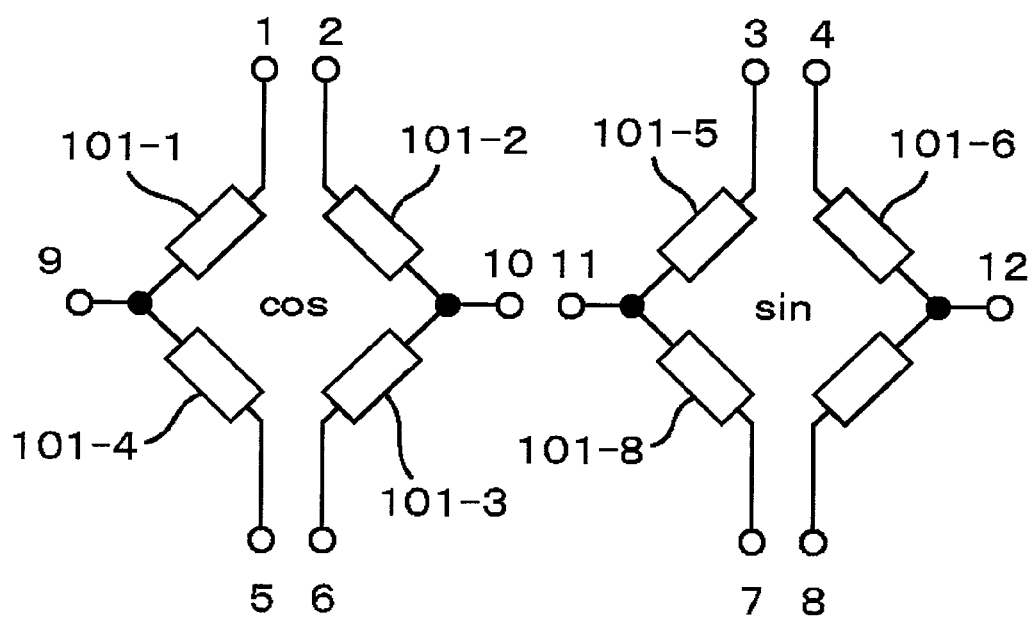
FIG. 17 shows a method of connecting magneto-resistive elements of a magnetic field detection apparatus in accordance with an embodiment of the present invention.

FIG. 17 shows a bridge connection of GMR elements of a magnetic field detection apparatus with a configuration similar to that described in Embodiment 1. Four GMR elements 101-1 to 101-4 form a bridge that outputs a signal corresponding to cos θ, in a manner described with reference to FIG. 1. The other four GMR elements 101-5 to 101-8 form a bridge that outputs a signal corresponding to sin θ, which are formed such that the magnetization direction of the pinned magnetic layer 13 of each GMR element is rotated by 90° from that of the GMR elements 101-1 to 101-4. Description has been made with reference to Embodiment 1 that an offset voltage can be eliminated by dividing the bridge corresponding to cos θ into two half-bridges and varying the excitation voltages. Similarly, in FIG. 17, the bridge corresponding to sin θ is also divided into two half-bridges. With such a configuration, it is possible to eliminate an offset voltage resulting from property deviation of the GMR elements and the like, and thus to realize excellent temperature characteristics as described in Embodiment 1. In the configuration of FIG. 17, the number of the terminals of the GMR bridges is 12.

Figure 18:
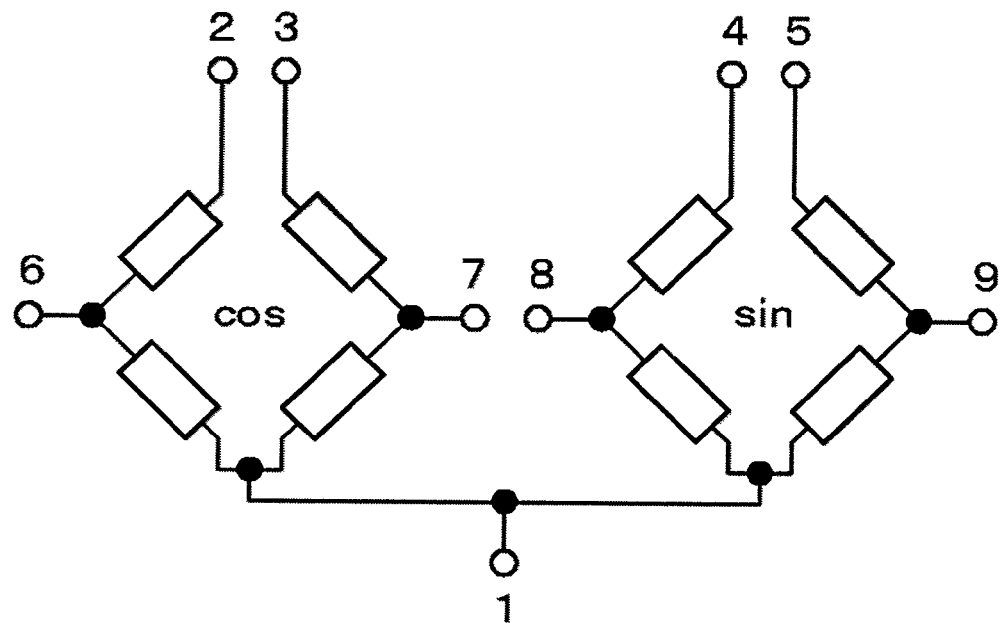
FIG. 18 shows a method of connecting magneto-resistive elements of a magnetic field detection apparatus in accordance with an embodiment of the present invention.

FIG. 18 shows a variation of the bridge connection of the GMR elements. Negative-polarity terminals of four half-bridges are connected to form a common terminal. Accordingly, the number of the terminals of the GMR bridges is reduced to nine. Reducing the number of the terminals in this manner allows a reduction in the number of circuits of the negative-polarity output circuit of the GMR elements. Thus, the circuit portion of the magnetic field detection apparatus can be simplified and a cost reduction can be achieved. Meanwhile, the positive-polarity terminals of the four half-bridges are separate in the configuration of FIG. 18. Thus, an offset voltage can be compensated by varying the voltages applied to the positive-polarity terminals, whereby an advantageous effect similar to that of Embodiment 1 can be obtained.

Figure 19:
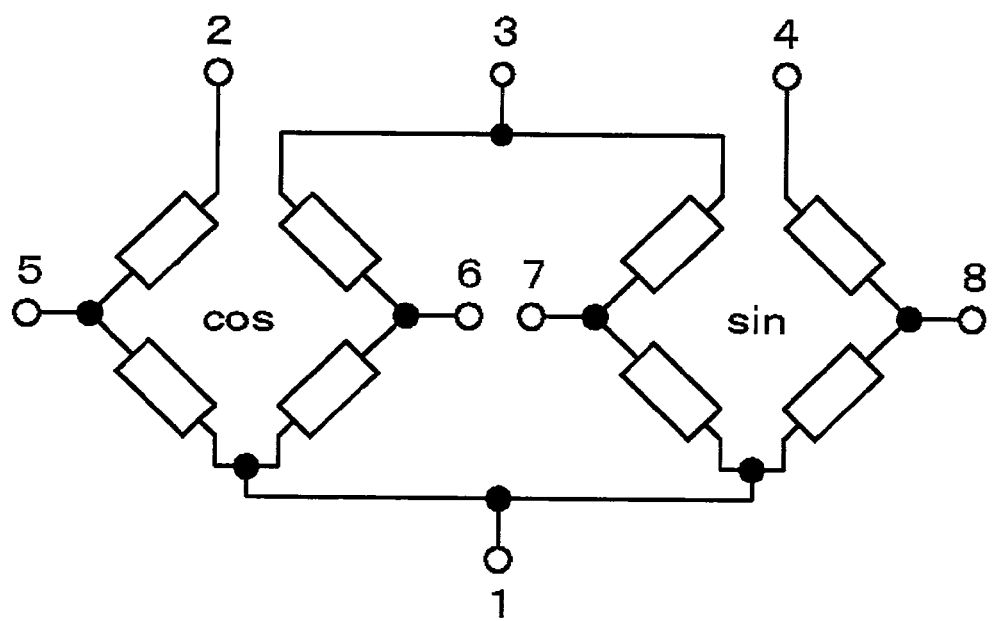
FIG. 19 shows a method of connecting magneto-resistive elements of a magnetic field detection apparatus in accordance with an embodiment of the present invention.

FIG. 19 shows still another variation of the bridge connection of the GMR elements. Not only are the negative-polarity terminals of the four half-bridges connected to form a common terminal, but one of the positive-polarity terminals of the COS bridge and one of the positive-polarity terminals of the SIN bridge are connected. With such a configuration, the number of the terminals of the bridge of the GMR elements is reduced to eight. Accordingly, the number of the driving circuits of the GMR elements can further be reduced, and thus a further cost reduction can be achieved. Further, since the number of the terminals in the configuration of FIG. 19 is eight, a package with an 8-pin configuration can be used, whereby the cost of the package of the GMR elements can be reduced.

Meanwhile, in the configuration of FIG. 19, different excitation voltages can be applied to the two half-bridges that constitute the COS bridge. Thus, excellent temperature characteristics can be obtained as in Embodiment 1. Such excellent temperature characteristics can also be obtained with the SIN bridge.

Although the negative-polarity terminals in FIGS. 18 and 19 are connected to form common wiring, it is obvious that similar effects can also be obtained when the four positive-polarity terminals are connected to form common wiring and the voltage of the negative-polarity terminal of each half-bridge is individually controlled.

Embodiment 9

A measurement apparatus for measuring pressure will be described with reference to FIGS. 13 to 15 as an another embodiment using the present invention.

Figure 13:
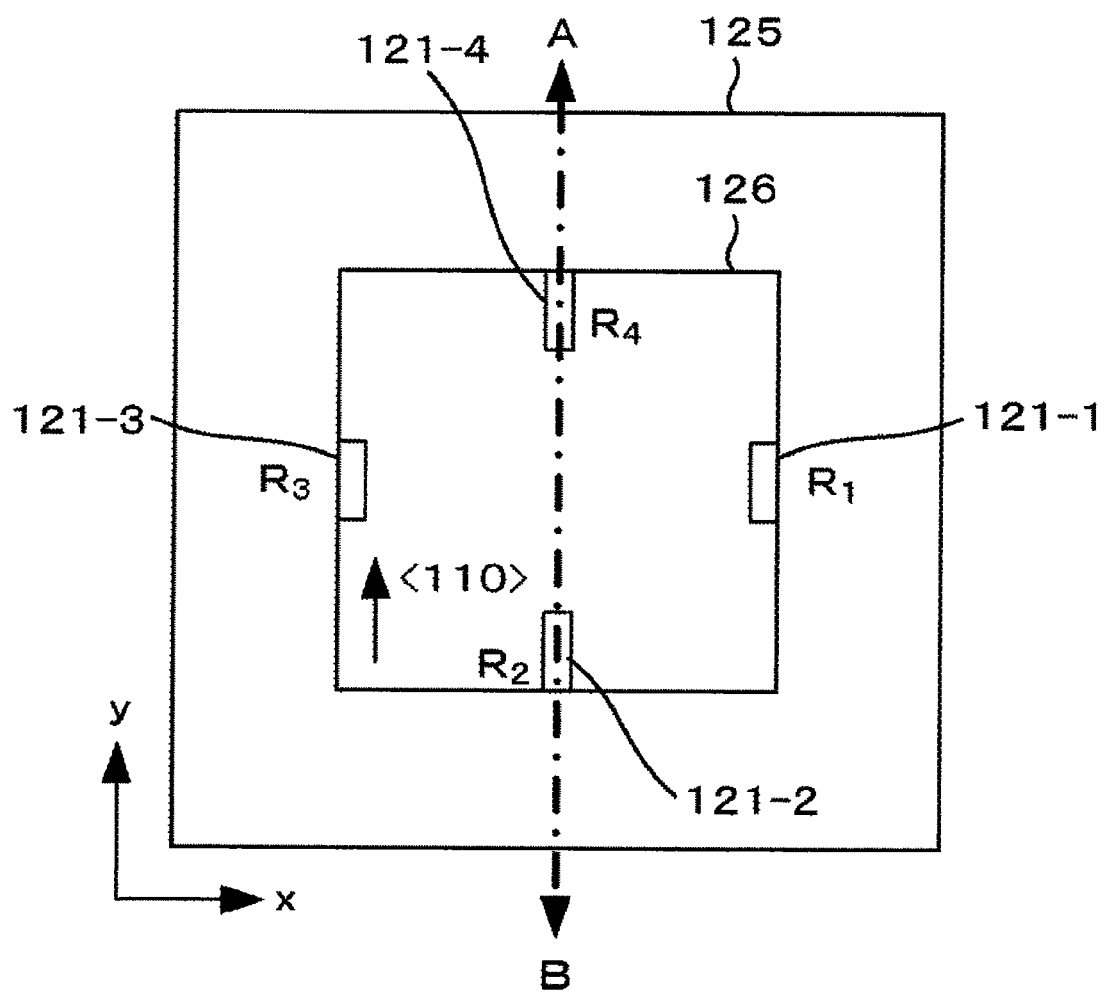
FIG. 13 is a plan view of a pressure sensor unit of an apparatus for measuring pressure in accordance with an embodiment of the present invention.

FIG. 13 is a plan view of a pressure sensor unit of a measurement apparatus of the present embodiment. FIG. 14 is a cross-sectional view along a line A-B of FIG. 13. FIG. 15 shows a method of connecting a pressure sensor unit, an excitation circuit, and a detection circuit.

The present embodiment concerns an apparatus for measuring pressure using a semiconductor strain gauge pressure sensor. In the present embodiment, four semiconductor strain gauges 121-1 to 121-4 are formed on a diaphragm 126 which is formed on a silicon substrate 125. The strain gauges are formed on the diaphragm 126 in an arrangement shown in FIG. 13, and are connected as shown in FIG. 15. That is, a pair of the strain gauges (121-1 and 121-3) are disposed on two opposite sides of the bridge circuit of the pressure sensor, and the other pair of the strain gauges (121-2 and 121-4) are disposed on the other two opposite sides.

In the present embodiment, an n-type silicon wafer is used for the silicon substrate 125, and the silicon substrate 125 is etched to form a diaphragm 126. Then, a predetermined position of the silicon substrate is doped with boron (B) to obtain p-type silicon, and piezo-resistive elements formed from such p-type silicon are used as the strain gauges 121.

In FIG. 13, the x-axis direction and the y-axis direction are defined as shown, and the <110> axis of the n-type silicon substrate is aligned in the y-axis direction.

An example of a pressure sensor using silicon piezo-resistive elements is described in, for example, Reference 4 (IEEE Transaction on Electron Devices, vol. ED-32, No. 7, pp. 1191-1195 (1985))

The resistance of the strain gauge 121 changes by the piezo-resistive effect. The resistance R of the piezo-resistive element 121-1 changes in response to the difference $\Delta\sigma$ between stress $\sigma_{1x}$ applied to the piezo-resistive element 121-1 in the x direction and stress $\sigma_{1y}$ applied thereto in the y direction ($\Delta\sigma=\sigma_{1y}-\sigma_{1x}$). The amount of such resistance change $\Delta R$ is given by the following formula:

$$\Delta R/R = (K/2)\Delta\sigma \qquad \text{[Formula 23]}$$

Here, K is the coefficient of piezo-resistive effect. For the strain gauge, a metal strain gauge can be used in addition to the semiconductor strain gauge used in the present embodiment. A semiconductor strain gauge is advantageous in that it has a larger coefficient K of piezo-resistive effect as the number of conductive carriers thereof is smaller than that of metal, and thus has high detection sensitivity to the amount of strain.

Figure 14:
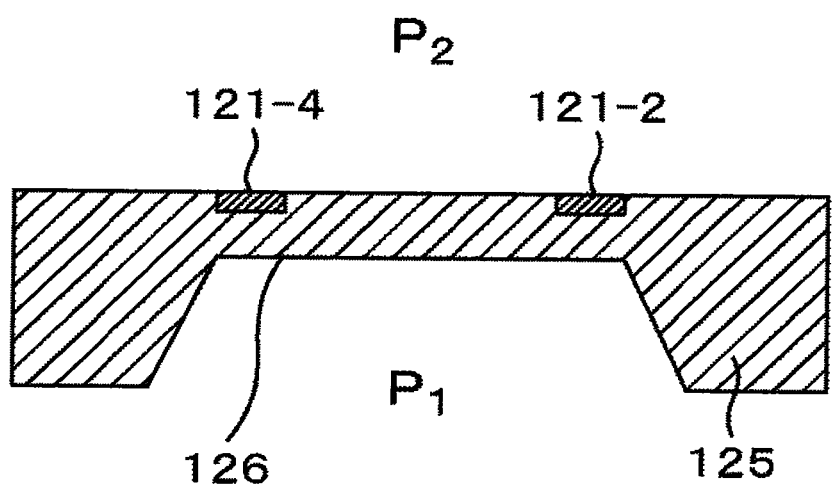
FIG. 14 is a cross-sectional view of a pressure sensor unit of an apparatus for measuring pressure in accordance with an embodiment of the present invention.

Pressures at opposite sides of the diaphragm 126 are indicated by $P_1$ and $P_2$ (FIG. 14). The stress difference $\Delta\sigma$ is proportional to the pressure difference $\Delta P=(P_1-P_2)$. Since the resistance of the strain gauge changes in proportion to the pressure difference $\Delta P$, measurement of the pressure difference $\Delta P$ is possible.

In the arrangement of FIG. 13, a change in resistance due to the stress difference $\Delta\sigma$ between the strain gauge $R_1$ (121-1) and the strain gauge $R_4$ (121-4) has the following relationship:

$$\Delta R_1/R_1 = -\Delta R_4/R_4 = (K/2)\Delta\sigma \qquad \text{[Formula 24]}$$

Figure 15:
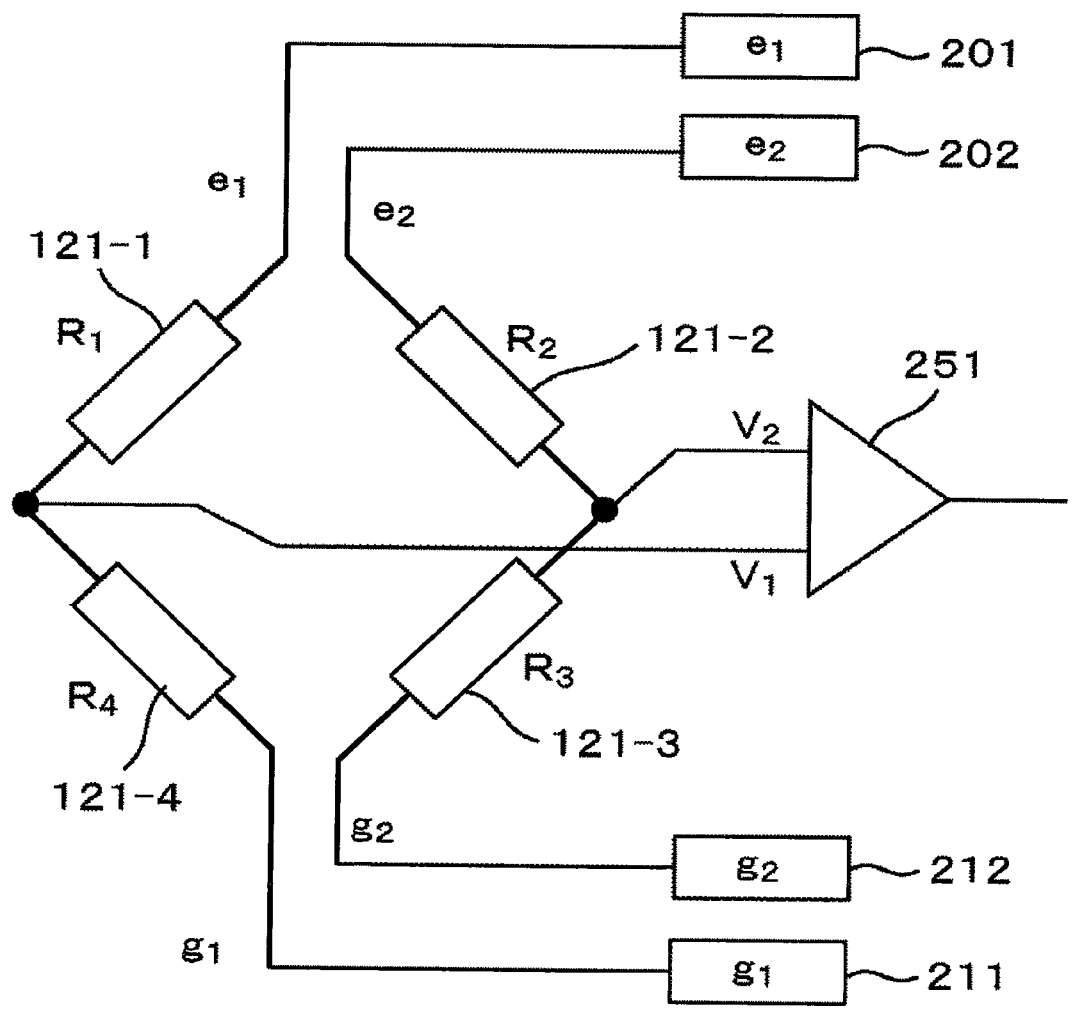
FIG. 15 shows a connection method of an apparatus for measuring pressure in accordance with an embodiment of the present invention.

Thus, a signal voltage $\Delta V$ with the configuration of FIG. 15 is determined as follows from Formula 12:

$$\Delta V = \Delta V_0 + CR(K/2)\Delta\sigma \qquad \text{[Formula 25]}$$

Here, $\Delta V_0$ is given by Formula 11 and the coefficient C is given by Formula 13.

Thus, provided that there is no pressure difference ($\Delta P=0$), $\Delta V_0=0$ is obtained by adjusting the excitation voltages $e_1$ and $e_2$ such that $\Delta V=0$. Accordingly, $\Delta V$ is given by:

$$V = CR(K/2)\Delta\sigma \qquad \text{[Formula 26]}$$

Thus, the signal voltage $\Delta V$ can be made proportional to the stress difference $\Delta\sigma$. That is, $\Delta V$ is proportional to the pressure difference $\Delta P$.

Next, a change in signal voltage $\Delta V$ upon a temperature change is considered.

As seen from Formula 13, the product C×R remains unchanged even when the temperature has changed, because the temperature dependence of the numerator and that of the denominator are identical. Thus, the following formula is satisfied:

$$\frac{\partial \Delta V}{\partial T} = \frac{CR}{2}\frac{\partial K}{\partial T}\Delta\sigma \qquad \text{[Formula 27]}$$

Thus, a signal voltage when the temperature has changed by $\Delta T$ is given by:

$$\Delta V(T+\Delta T) = CR\frac{K}{2}\Delta\sigma\left(1 + \frac{1}{K}\frac{\partial K}{\partial T}\Delta T\right) \qquad \text{[Formula 28]}$$

Thus, by setting the temperature dependence of the gain A of the amplifier that amplifies the signal voltage $\Delta V$ such that it can be expressed by Formula 29, it becomes possible to cancel out the temperature dependence of the amplitude of $\Delta V$.

$$\frac{1}{A}\frac{\partial A}{\partial T} = -\frac{1}{K}\frac{\partial K}{\partial T} \qquad \text{[Formula 29]}$$

That is, by setting the absolute value of the temperature dependence coefficient of the piezo-resistive effect and the absolute value of the temperature dependence coefficient of the gain of the amplifier to be equal and also by reversing the sign, it becomes possible to cancel out the temperature dependence of the amplitude of ΔV.

Figure 27:
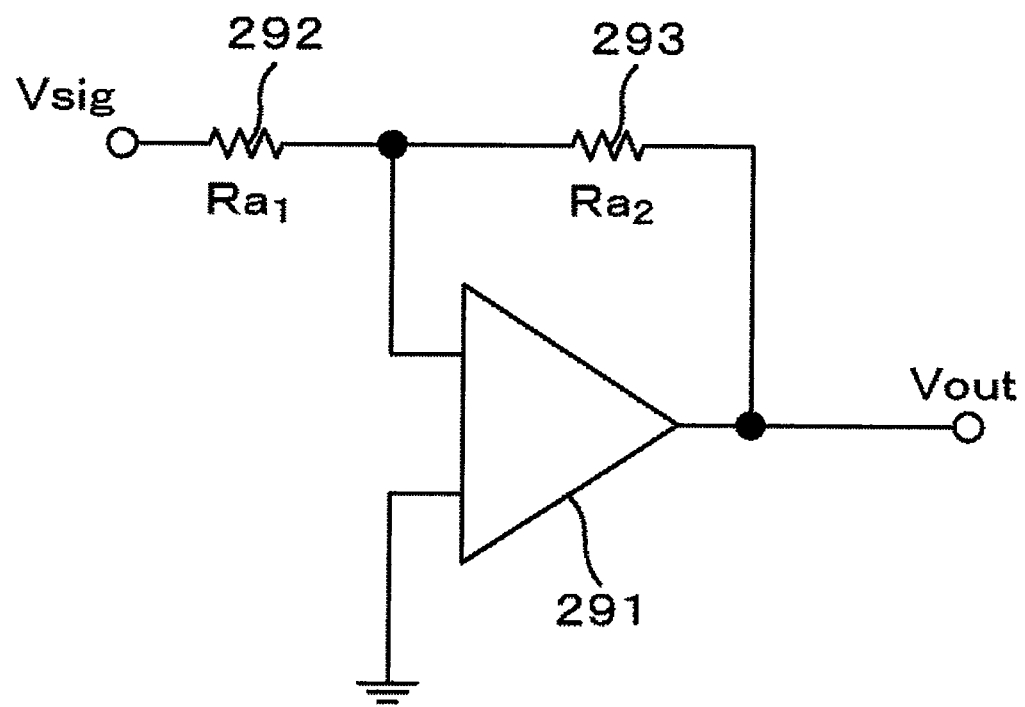
FIG. 27 shows a signal processing circuit of an apparatus for measuring pressure in accordance with an embodiment of the present invention.

In the present embodiment, an output signal Vsig of the differential amplifier 251 (FIG. 15) is inputted to a circuit of FIG. 27 in order to satisfy the conditions of Formula 29. In FIG. 27, resistance $R_{a2}$ (293) is the resistance obtained by doping silicon with a proper amount of impurities, and numeral 291 denotes an operational amplifier. The gain A of the circuit is given by:

$$A = -\frac{R_{a2}}{R_{a1}} \qquad \text{[Formula 30]}$$

Thus, the temperature characteristics of the resistance $R_{a2}$ equal the temperature characteristics of the gain A.

The temperature dependence coefficient of the silicon piezo-resistive effect $((1/K) \times (\partial K/\partial T))$ has a negative value. Meanwhile, the temperature dependence coefficient of the resistance of silicon has a positive value, and the value depends on the density of dopant impurities. The temperature coefficient of resistivity changes in the range of 600 to 4000 [ppm/C.°] for dopant densities of $10^{18}$ to $10^{21}$ [cm$^{-3}$]. Thus, properly setting the dopant densities of the resistance $R_{a2}$ (293) can satisfy Formula 29. In this manner, the temperature dependence of the amplitude of the signal voltage ΔV of the pressure sensor is cancelled out.

Meanwhile, an offset voltage of the signal voltage ΔV has been eliminated by adjusting the excitation voltages $e_1$ and $e_2$ as described above. Accordingly, ΔV does not include an offset voltage even when the temperature has changed, as described above.

An apparatus for measuring pressure using strain gauges involves deviation in patterning occurring in the formation of the strain gauges 121, deviation in property resulting from the impurity doping process, deviation in temperature characteristics, and the like. Thus, there have conventionally been problems that a signal voltage outputted from the differential detector 251 includes an offset voltage, and the temperature characteristics of the measurement apparatus are insufficient.

In order to solve such problems, according to the present invention, the positive-polarity driving circuit $e_1$ (201) that excites the half-bridge including the strain gauges 121-1 and 121-4, and the positive-polarity driving circuit $e_2$ (202) that excites the half-bridge including the strain gauges 121-2 and 121-3 are provided as separate driving circuits as shown in FIG. 15, and voltages applied to the two half-bridges are set at different values, whereby an offset voltage of the output signal of the differential detector 251 is set to zero. Accordingly, the offset voltage can be kept at zero even when the temperature is changed, and thus the temperature characteristics of the apparatus for measuring pressure can be improved.

Figure 16:
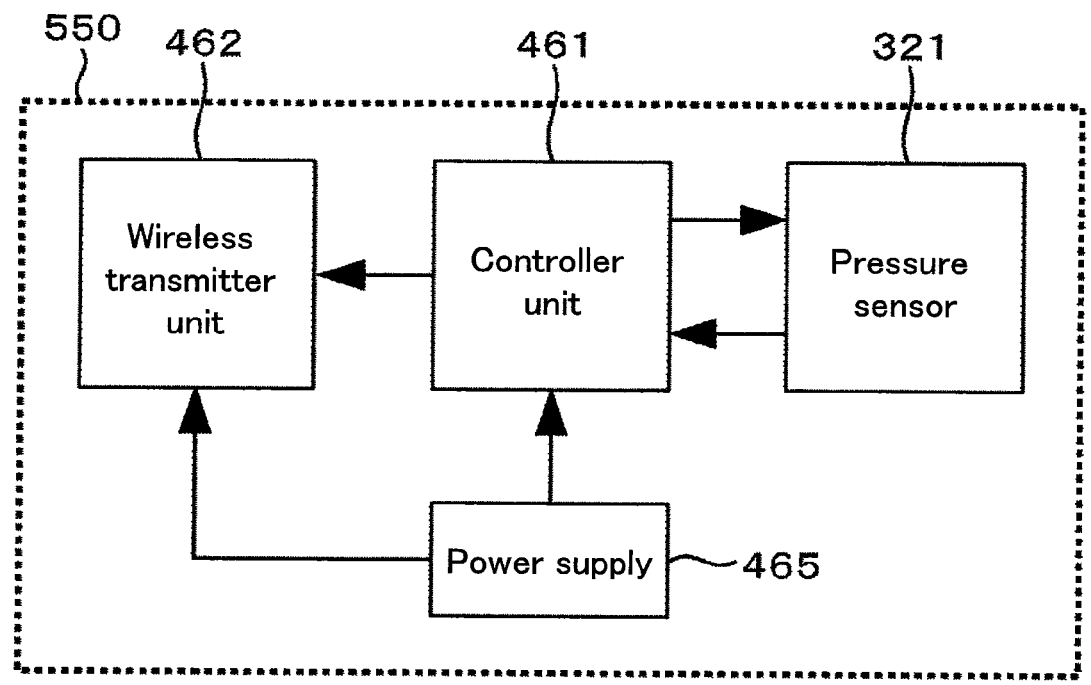
FIG. 16 shows the configuration of a tire-pressure measuring apparatus in accordance with an embodiment of the present invention.
Figure 25:
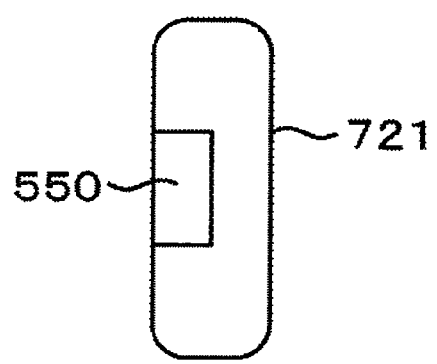
FIG. 25 schematically shows installation of a tire-pressure measuring apparatus in accordance with an embodiment of the present invention to a tire.
Figure 26:
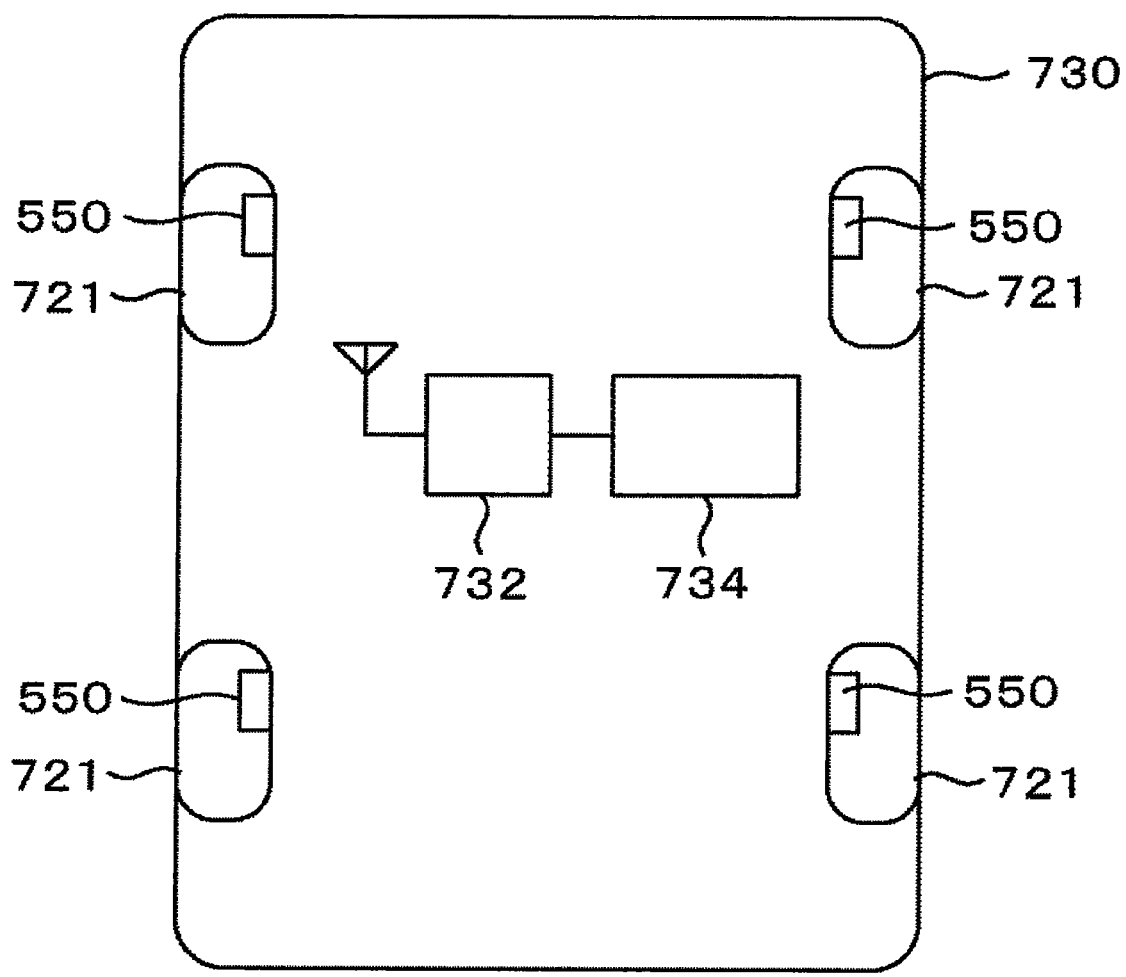
FIG. 26 shows the configuration of a tire-pressure monitoring apparatus in accordance with an embodiment of the present invention.

FIG. 16 shows the configuration of a tire-pressure measuring apparatus 550 of an automobile using the aforementioned apparatus for measuring pressure. FIGS. 25 and 26 each show the configuration of a tire-pressure monitoring apparatus using the tire-pressure measuring apparatus 550.

The measurement apparatus of the present embodiment includes a pressure sensor 321, a controller unit 461, a wireless transmitter unit 462, and a power supply 465. The pressure sensor is the sensor shown in FIGS. 13, 14, and 15. A controller unit 461 includes the positive-polarity driving circuits 201 and 202 that excite the pressure sensor, the negative-polarity driving circuits 211 and 212, and the differential amplifier 251 that detects a signal voltage ΔV.

The measured value of the tire pressure Pt is transmitted by the wireless transmitter unit 462. The power supply 465 includes a lithium battery and the like, and supplies electricity to the controller 461 and the wireless transmitter unit 462.

In the present embodiment, a voltage with the waveform shown in FIG. 11 is applied to the pressure sensor 321 to acquire a signal. As described above, the output voltages of the positive-polarity driving circuits 201 and 202 and the negative-polarity driving circuits 211 and 212 are set equal and no voltage is applied to the strain gauges in periods other than the excitation duration. Therefore, power consumption can be suppressed. In the present embodiment, the ratio of the excitation duration to the non-excitation duration is set to 1:10, whereby the power consumption of the pressure sensor is reduced to 1/10. Accordingly, a predetermined operation time can be ensured even if a power supply with a low battery capacity is used for the power supply 465.

Next, the configuration of the tire-pressure monitoring apparatus will be described with reference to FIGS. 25 and 26.

Each tire 721 mounted on a vehicle 730 is provided with the tire-pressure measuring apparatus 550. Accordingly, air pressure in the tire is measured.

As shown in FIG. 26, a tire-pressure monitoring controller 734 and a transceiver unit 732 are installed on the vehicle 730. A signal that has been wirelessly transmitted from the tire-pressure measuring apparatus 550 is received by the transceiver unit 732, and is then transmitted to the tire-pressure monitoring controller 734.

The tire-pressure monitoring controller 734 controls the vehicle based on the tire pressure information of each tire 721 (four tires in FIG. 26). The tire-pressure monitoring controller 734 also has a tire-pressure alarming function such that it generates and transmits an alarm signal when the measured tire pressure Pt exceeds a predetermined pressure range.

Embodiment 10

Figure 20:
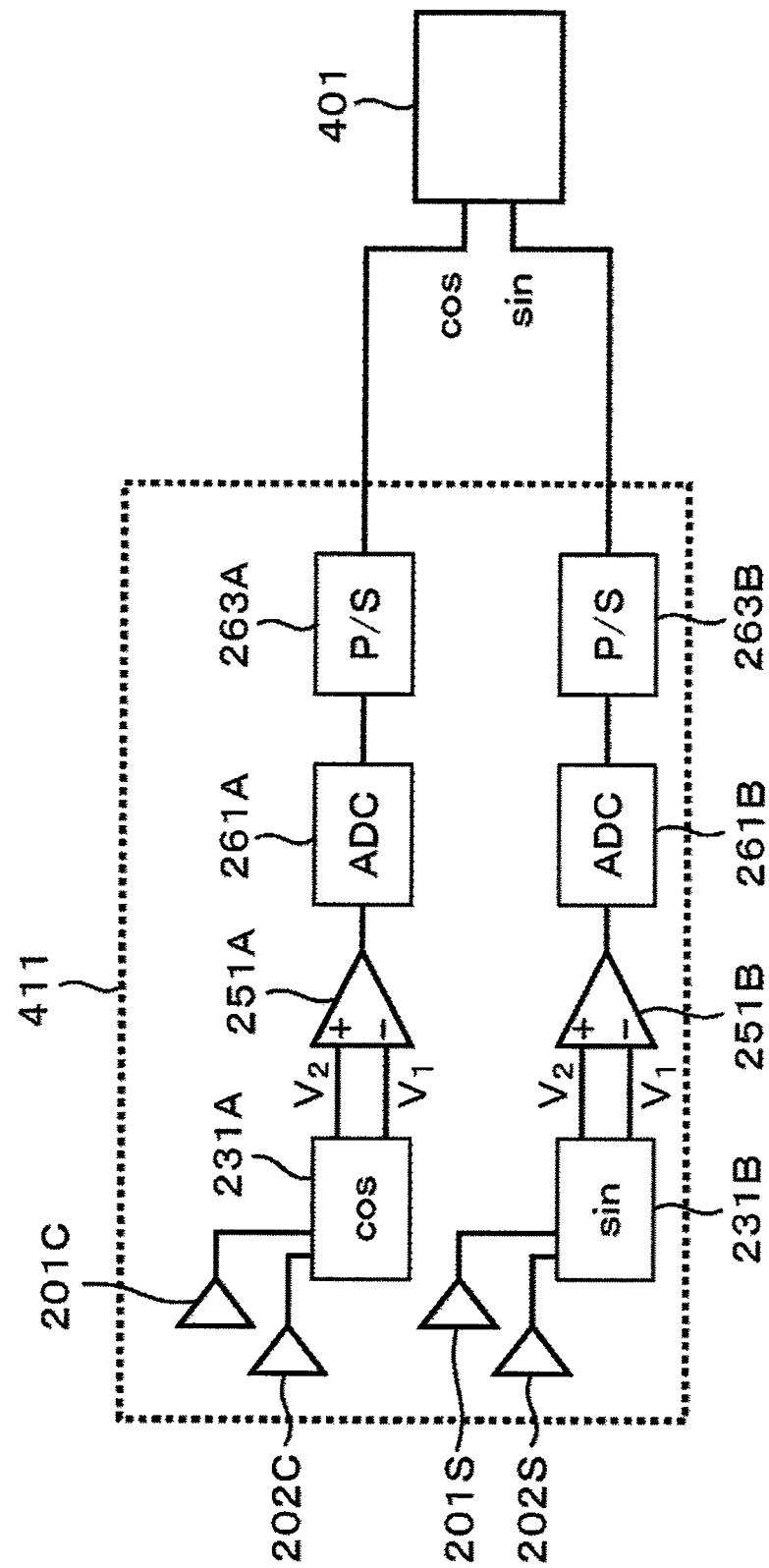
FIG. 20 shows the configuration of a magnetic field detection apparatus in accordance with an embodiment of the present invention.

Another embodiment of a magnetic field detection apparatus of the present invention will be described with reference to FIG. 20.

The present embodiment illustrates an example in which the magnetic field-detection sensor unit 411 and the signal processing unit 401 of the magnetic field detection apparatus are separately provided.

A magneto-resistive bridge 231A has the configuration shown in FIG. 1, and outputs, when excited by positive-polarity driving circuits 201C and 202C, a signal corresponding to cos θ. This signal is detected by a differential detector 251A, and is digitized by an analog-to-digital converter (hereinafter abbreviated as an "A/D converter" or an "ADC") 261A. The digitized signal corresponding to cos θ is converted into serial data by a parallel-to-serial converter 263A, and is then transmitted to the signal processing unit 401 via a cable, wiring, and the like.

Likewise, a magneto-resistive bridge 231B outputs a signal corresponding to sin θ. This output signal is also digitized and transmitted as serial data to the signal processing unit 401.

The signal processing unit 401 calculates the direction θ of a magnetic field using the circuit block configuration shown in FIG. 5, for example.

In the present embodiment, the signal processing unit 401 is spatially separated from the magnetic field-detection sensor unit 411, whereby the ambient temperature of the signal processing unit 401 can be kept at a relatively moderate temperature even when the magnetic field-detection sensor unit 411 is disposed in a place where a significant temperature change may occur such as, for example, in a motor or in the vicinity of an automotive engine. Accordingly, a high-speed, high-performance integrated circuit can be advantageously used for the signal processing unit 401.

According to the present embodiment, the angle of a magnetic field can be accurately measured without the influence of noise by performing signal transmission between the magnetic field-detection sensor unit 411 and the signal processing unit 401 with digitized signals.

Embodiment 11

Another embodiment of a measurement apparatus of the present invention will be described with reference to FIGS. 21, 22, and 23. Here, a magnetic field detection apparatus using magneto-resistive elements will be described as an exemplary measurement apparatus.

The present embodiment concerns another embodiment of the magnetic field detection apparatus described in Embodiment 6 in which an offset voltage resulting from a detection circuit is eliminated.

Figure 21:
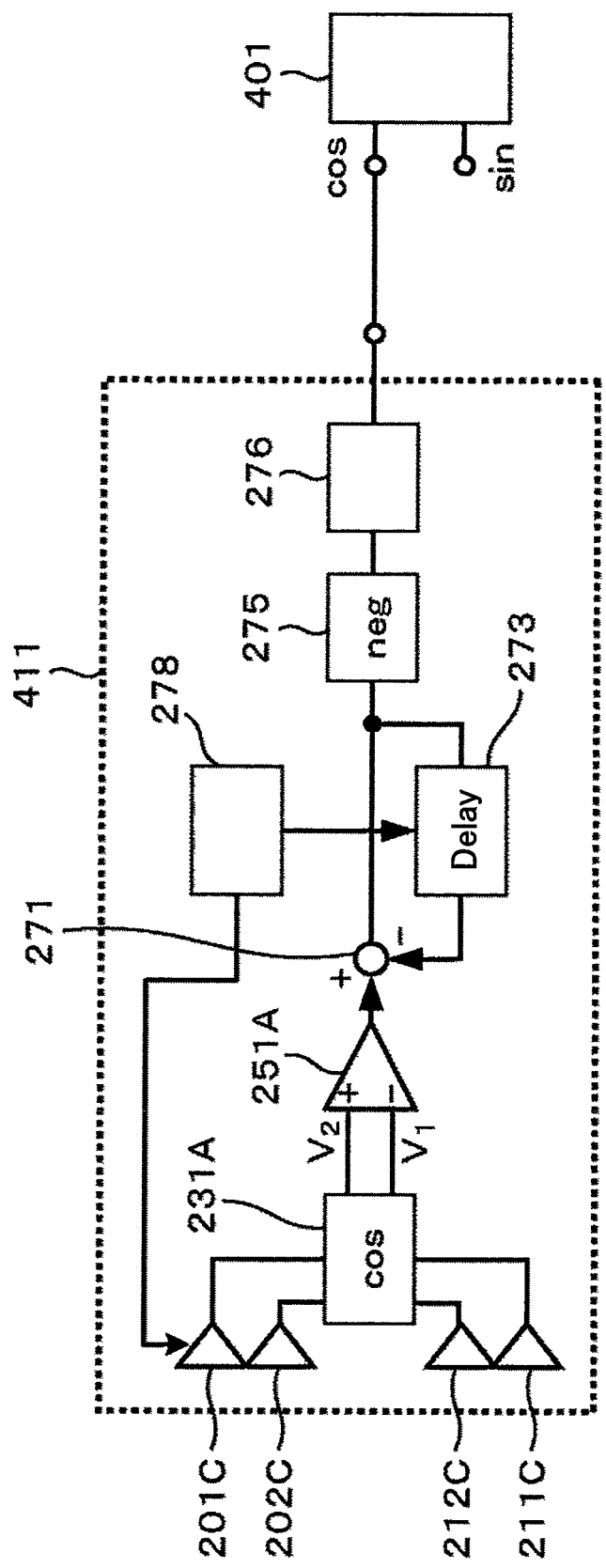
FIG. 21 shows the configuration of a magnetic field detection apparatus in accordance with an embodiment of the present invention.

FIG. 21 is a circuit block diagram showing the configuration of the magnetic field-detection sensor unit 411 of the present embodiment. Drive pulses from the positive-polarity driving circuits 201C and 202C are applied to the positive-polarity terminals of the magneto-resistive bridge 231A. Upon application of the drive pulses, the magneto-resistive bridge 231A outputs a signal voltage. The signal voltage is differentially detected by the differential detector 251A, and is then inputted to a subtraction-operation unit 271. An output of the subtraction-operation unit 271 is delayed by a delay unit 273, and is then inputted to a negative input terminal of the subtraction-operation unit 271. In this manner, a temporal differential-operation unit is constructed using the delay unit 273. The output of the subtraction-operation unit 271 is inputted to a sign-changing unit 275 for reversal of the sign, and then, the signal is inputted to a filter unit 276, so that signal conditioning such as subtraction of signal noises is performed. The operation timing of the delay unit 273 will be described in detail below with reference to FIG. 23. An output signal of the filter unit 276 is inputted to a cos-signal input terminal of the signal processing unit 401.

Although not shown in FIG. 21, the SIN bridge is also provided with the magnetic field-detection sensor unit 411 with a similar configuration, and a signal is inputted to a sin-signal input terminal of the signal processing unit 401.

Figure 22:
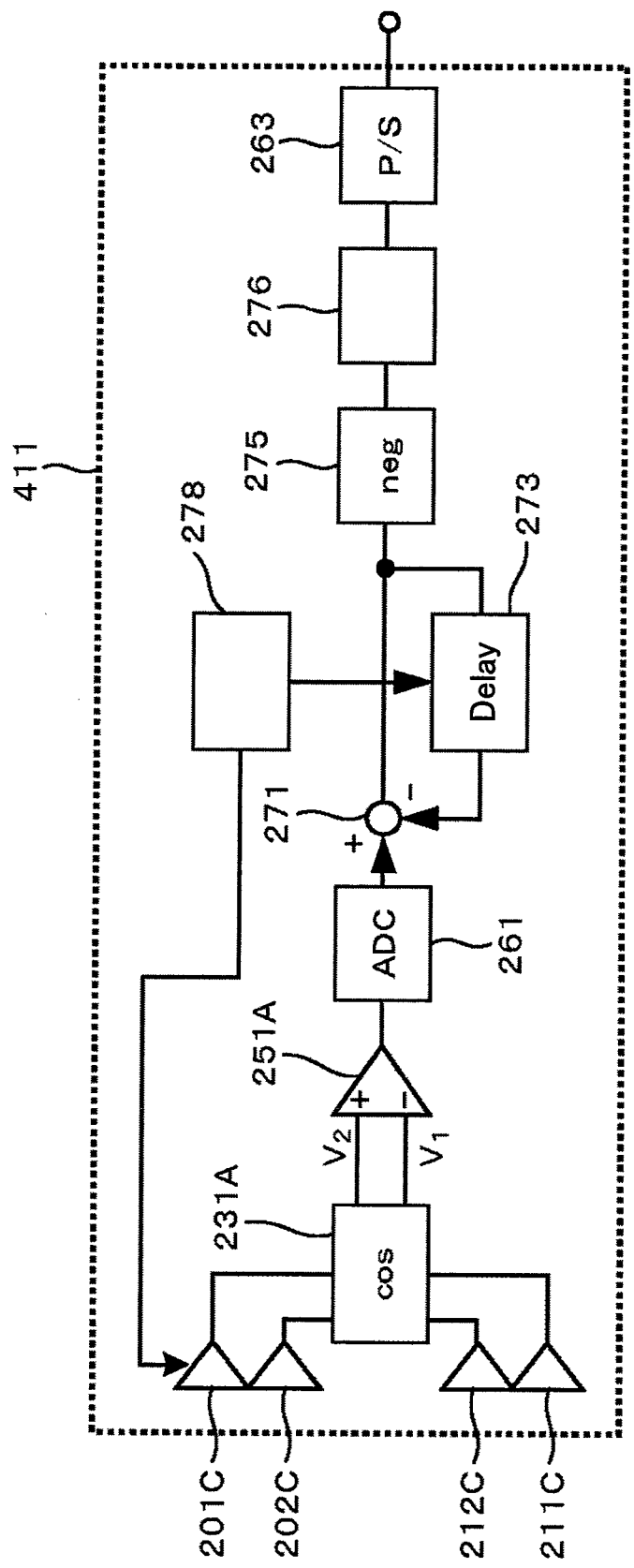
FIG. 22 shows the configuration of a magnetic field-detection sensor unit of a magnetic field detection apparatus in accordance with an embodiment of the present invention.

FIG. 22 shows another configuration of the present embodiment. In the configuration of FIG. 22, the function of FIG. 21 is performed through digital signal processing.

Drive pulses from the positive-polarity driving circuits 201C and 202C are applied to the positive-polarity terminals of the magneto-resistive bridge 231A. Upon application of the drive pulses, the magneto-resistive bridge 231A outputs a signal voltage. The signal voltage is differentially detected by the differential detector 251A, and is then converted into a digital signal by the A/D converter 261. The digitized signal is inputted to the subtraction-operation unit 271. The output of the subtraction-operation unit 271 is delayed by the delay unit 273, and is then inputted to the negative input terminal of the subtraction-operation unit 271. In this manner, a temporal differential-operation unit is constructed using the delay unit 273. An output of the subtraction-operation unit 271 is inputted to the sign-changing unit 275 for reversal of the sign, and then, the signal is inputted to the filter unit 276, so that signal conditioning such as subtraction of signal noises is performed. The signal is converted into a serial signal by the parallel-to-serial converter 263, and is then transmitted to the signal processing unit 401. The signal processing unit 401 is omitted in FIG. 22. The operation timing of the delay unit 273 will be described in detail below with reference to FIG. 23.

Although FIG. 22 only shows the magneto-resistive bridge 231A that outputs a signal corresponding to cos θ, the magneto-resistive bridge that outputs a signal corresponding to sin θ is also provided with a processing circuit with the same configuration, and a signal obtained thereby is transmitted to the signal processing unit 401. The signal processing unit calculates, based on a combination of the signal corresponding to cos θ and the signal corresponding to sin θ, the direction of a magnetic field, and outputs the result.

The operation timing of the delay unit 273 in FIG. 22 will be described with reference to FIG. 23.

Figure 23:
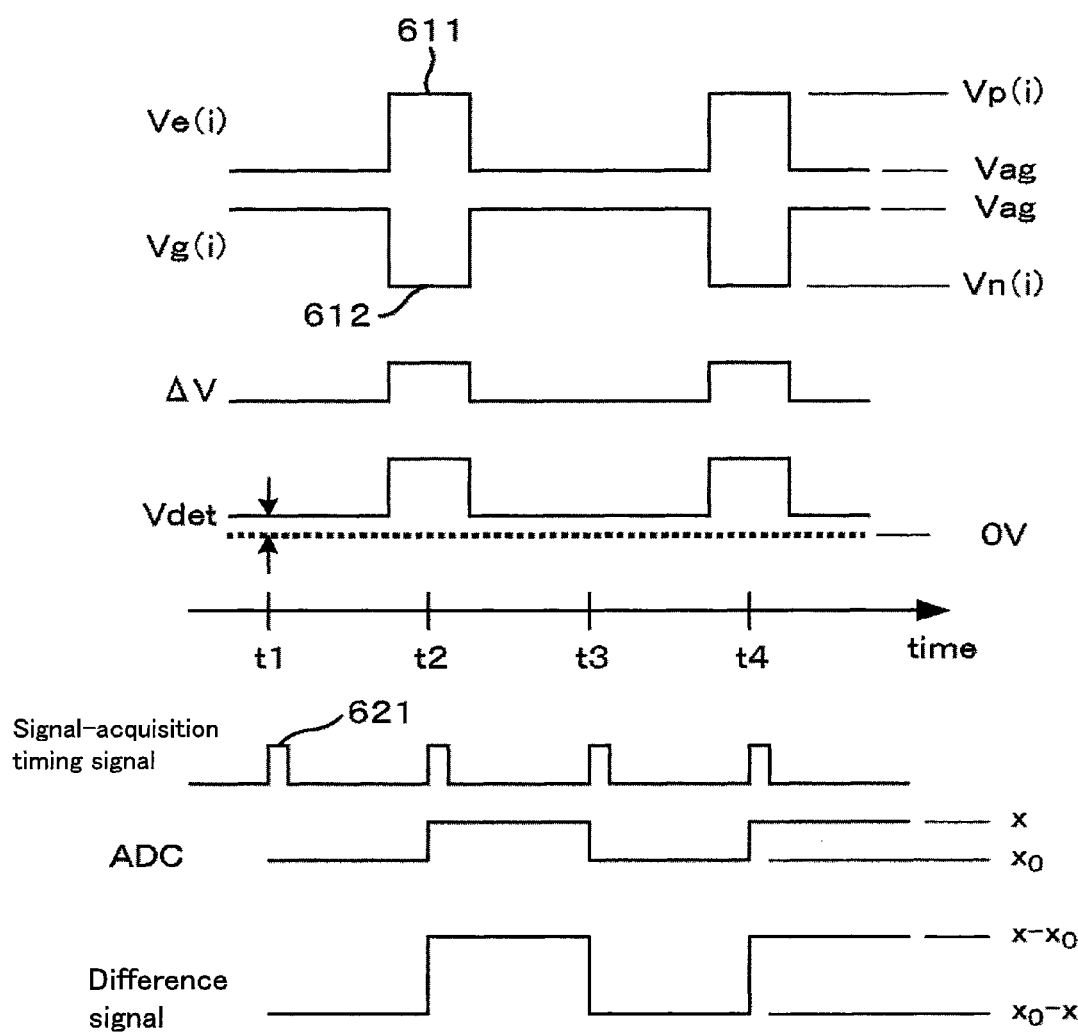
FIG. 23 illustrates a method of processing signals with a magnetic field detection apparatus in accordance with an embodiment of the present invention.

In FIG. 23, the output voltage of the positive-polarity driving circuit 201C connected to the positive-polarity terminal of the magneto-resistive bridge 231A is indicated by Ve, and the output voltage of the negative-polarity driving circuit 211C connected to the negative-polarity terminal is indicated by Vg. At time $t_1$, both of the output voltages Ve and Vg are at Vag. Thus, since the positive-polarity terminal and the negative-polarity terminal of the magneto-resistive bridge 231A are at equal voltage levels, the difference signal $\Delta v = V_2 - V_1$ equals zero. Thus, the value of the output voltage Vdet of the differential detector at the time $t_1$ is an offset voltage of the detection circuit. The output voltage of Vdet at the time $t_1$ is indicated by $X_0$.

At time $t_2$, the positive-polarity driving circuit 201C outputs the positive-polarity pulse 611, and the negative-polarity driving circuit 211C outputs the negative-polarity pulse 612. Thus, a signal corresponding to the detected direction θ of the magnetic field is outputted as the difference signal $\Delta V$ of the magneto-resistive bridge 231A. The value of the output voltage Vdet of the differential detector 251A at the time $t_2$ is indicated by x.

A timing generator 278 (FIG. 22) generates a signal-acquisition timing signal 621, and causes the A/D converter 261 to operate at times $t_1$, $t_2$, $t_3$, and $t_4$. Then, a signal waveform indicated by ADC in FIG. 23 is obtained. Further, the output voltage of the differential detection circuit is delayed with the delay unit 273 by one clock of the signal-acquisition timing signal 621. When the difference between the delayed signal and a new signal from the differential detection circuit is determined by the subtraction-operation unit 271, a signal in which $(x-x_0)$ and $(x_0-x)$ are alternately repeated is obtained as indicated by "DIFFERENCE SIGNAL" in FIG. 23. Thus, if sign reversal is effected every clock of the signal-acquisition timing signal 621 with the sign-changing unit 275, $(x-x_0)$ is obtained. $(x-x_0)$ corresponds to a value obtained by subtracting the offset voltage of the circuit from the output of the differential detector 251.

As described above, according to the present embodiment, an offset signal resulting from deviation in the circuit and the like can easily be eliminated from the output signal of the differential detector.

As seen from FIG. 23, in the present embodiment, the signal-acquisition timing signal 621 is outputted once in the period in which the positive-polarity output pulse 611 is outputted and once in the period in which the positive-polarity output pulse is not outputted. Thus, a pulse, which is synchronous with the positive-polarity output pulse 611 and has a frequency twice that of the positive-polarity output pulse, can be used, for example.

A signal obtained in this manner is subjected to parallel-to-serial conversion, and is then transmitted to the signal processing unit 401 as digital data. Signal transmission between the magnetic field-detection sensor unit 411 and the signal processing unit 401 is performed with digital data. Thus, high-accuracy measurement which is insusceptible to the influence of noise and the like can be performed.

In the present embodiment, signal transmission between the magnetic field-detection sensor unit 411 and the signal processing unit 401 is adapted to be insusceptible to the influence of noise. Thus, the signal processing unit 401 can be spatially separated from the magnetic field-detection sensor unit 411. When the two units are spatially separated, it is possible to keep the ambient temperature of the signal processing unit 401 at a relatively moderate temperature even when the magnetic field-detection sensor unit 411 is disposed in a place where a significant temperature change may occur such as, for example, in a motor or in the vicinity of an automotive engine. Accordingly, a high-speed, high-performance integrated circuit can be advantageously used for the signal processing unit 401.

Although description has been made above of an example in which a difference signal is obtained from an A/D converted digital signal corresponding to FIG. 22, the same effects can be obtained even when a difference signal is obtained from an analog signal with the configuration shown in FIG. 21.

Although the present embodiment illustrates an example of a magnetic field detection apparatus using a magneto-resistive bridge, it is obvious that the present invention can also be applied to measurement apparatuses using various sensors with bridge circuits. Examples of such sensors include measurement apparatuses using pressure sensors as detailed in the foregoing embodiments.

What is claimed is:
1. A magnetic field detection apparatus comprising:
   at least four magneto-resistive elements including first to fourth magneto-resistive elements;
   a first positive-polarity terminal;
   a first negative-polarity terminal;
   a first detection terminal;
   a second positive-polarity terminal;
   a second negative-polarity terminal;
   a second detection terminal;
   two connections including first and second connections, the first connection being sequentially connected to the first positive-polarity terminal, the first magneto-resistive element, the first detection terminal, the fourth magneto-resistive element, and the first negative-polarity terminal, and the second connection being sequentially connected to the second positive-polarity terminal, the second magneto-resistive element, the second detection terminal, the third magneto-resistive element, and the second negative-polarity terminal;
   a circuit configured to measure a signal voltage between the first detection terminal and the second detection terminal;
   a first driving circuit configured to apply a voltage between the first positive-polarity terminal and the first negative-polarity terminal; and
   a second driving circuit configured to apply a voltage between the second positive-polarity terminal and the second negative-polarity terminal,
   wherein a first excitation voltage between the first positive-polarity terminal and the first negative-polarity terminal differs from a second excitation voltage between the second positive-polarity terminal and the second negative-polarity terminal.

2. The magnetic field detection apparatus according to claim 1, wherein
   each of the magneto-resistive elements is a giant magneto-resistive element having a pinned magnetic layer with a pinned magnetization direction and a free magnetic layer, and
   the four magneto-resistive elements include two magneto-resistive elements of a first type whose pinned magnetic layers are magnetized in a first direction, and magneto-resistive elements of a second type whose pinned magnetic layers are magnetized in a second direction.

3. The magnetic field detection apparatus according to claim 1, wherein
   each of the magneto-resistive elements is an anisotropic magneto-resistive element whose resistance changes depending on an angle made by a current flow direction and a direction of a magnetic field to be detected.

4. A rotating angle detection apparatus comprising the magnetic field detection apparatus according to claim 1 and a rotating unit on which a magnetic-field generator is mounted.

5. A position detection apparatus comprising the magnetic field detection apparatus according to claim 1 and a moving unit on which a magnetic-field generator is mounted.

6. A motor comprising:
   a stator with a coil;
   a rotor with a magnetic-field generator;
   a driving circuit configured to feed a current to the coil; and
   a control circuit configured to control the driving circuit,
   wherein an output signal of the magnetic field detection apparatus according to claim 1 is connected to the control circuit.

7. A throttle valve control apparatus comprising:
   a throttle valve;
   a shaft on which the throttle valve is mounted;
   a magnetic-field generator adapted to rotate in conjunction with rotation of the shaft; and
   the magnetic field detection apparatus according to claim 1.

8. A magnetic field detection apparatus comprising:
   at least four magneto-resistive elements including first to fourth magneto-resistive elements;
   a first positive-polarity terminal;
   a first negative-polarity terminal;
   a first detection terminal;
   a second positive-polarity terminal;
   a second negative-polarity terminal;
   a second detection terminal;
   two connections including first and second connections, the first connection being sequentially connected to the first positive-polarity terminal, the first magneto-resistive element, the first detection terminal, the fourth magneto-resistive element, and the first negative-polarity terminal, and the second connection being sequentially connected to the second positive-polarity terminal, the second magneto-resistive element, the second detection terminal, the third magneto-resistive element, and the second negative-polarity terminal;

a circuit configured to measure a signal voltage between the first detection terminal and the second detection terminal;

a first driving circuit configured to apply a voltage between the first positive-polarity terminal and the first negative-polarity terminal; and a second driving circuit configured to apply a voltage between the second positive-polarity terminal and the second negative-polarity terminal, wherein the first driving circuit includes, during operation of the magnetic field detection apparatus, a zero-voltage period in which the circuit applies equal potentials to the first positive-polarity terminal and the first negative-polarity terminal, and an excitation period in which the circuit applies different potentials to the first positive-polarity terminal and the first negative-polarity terminal, and the second driving circuit includes, during operation of the magnetic field detection apparatus, a zero-voltage period in which the circuit applies equal potentials to the second positive-polarity terminal and the second negative-polarity terminal, and an excitation period in which the circuit applies different potentials to the second positive-polarity terminal and the second negative-polarity terminal.

9. The magnetic field detection apparatus according to claim 8, wherein a difference voltage between the signal voltage in the excitation period and the signal voltage in the zero-voltage period is measured.

10. A measurement apparatus comprising:

four resistors including first to fourth resistors, at least one of the four resistors is a transducer element whose resistance changes depending on an ambient physical quantity;

a first positive-polarity terminal;
a first negative-polarity terminal;
a first detection terminal;
a second positive-polarity terminal;
a second negative-polarity terminal;
a second detection terminal;

two connections including first and second connections, the first connection being sequentially connected to the first positive-polarity terminal, the first resistor, the first detection terminal, the fourth resistor, and the first negative-polarity terminal, and the second connection being sequentially connected to the second positive-polarity terminal, the second resistor, the second detection terminal, the third resistor, and the second negative-polarity terminal;

a circuit configured to measure a signal voltage between the first detection terminal and the second detection terminal;

a first driving circuit configured to apply a voltage between the first positive-polarity terminal and the first negative-polarity terminal; and a second driving circuit configured to apply a voltage between the second positive-polarity terminal and the second negative-polarity terminal, wherein a first excitation voltage between the first positive-polarity terminal and the first negative-polarity terminal differs from a second excitation voltage between the second positive-polarity terminal and the second negative-polarity terminal.

11. The measurement apparatus according to claim 10, wherein the transducer element is an element whose resistance changes by a mechanical strain, the transducer element being disposed on a diaphragm, and the measurement apparatus measures a pressure difference between opposite sides of the diaphragm.

12. A measurement apparatus comprising:

four resistors including first to fourth resistors, at least one of the four resistors is a transducer element whose resistance changes depending on an ambient physical quantity;

a first positive-polarity terminal;
a first negative-polarity terminal;
a first detection terminal;
a second positive-polarity terminal;
a second negative-polarity terminal;
a second detection terminal;

two connections including first and second connections, the first connection being sequentially connected to the first positive-polarity terminal, the first resistor, the first detection terminal, the fourth resistor, and the first negative-polarity terminal, and the second connection being sequentially connected to the second positive-polarity terminal, the second resistor, the second detection terminal, the third resistor, and the second negative-polarity terminal;

a circuit configured to measure a signal voltage between the first detection terminal and the second detection terminal; and a first driving circuit configured to apply a voltage between the first positive-polarity terminal and the first negative-polarity terminal, wherein the first driving circuit includes, during operation of the measurement apparatus, a zero-voltage period in which the circuit applies equal potentials to the first positive-polarity terminal and the first negative-polarity terminal, and an excitation period in which the circuit applies different potentials to the first positive-polarity terminal and the first negative-polarity terminal.

13. The measurement apparatus according to claim 12, wherein the second positive-polarity terminal is connected to the first positive-polarity terminal, and the second negative-polarity terminal is connected to the first negative-polarity terminal, and a difference voltage between the signal voltage in the excitation period and the signal voltage in the zero-voltage period is measured.

14. The measurement apparatus according to claim 12, further comprising a second driving circuit configured to apply a voltage between the second positive-polarity terminal and the second negative-polarity terminal, wherein the second driving circuit applies equal potentials to the second positive-polarity terminal and the second negative-polarity terminal in the zero-voltage period, and a difference voltage between the signal voltage in the excitation period and the signal voltage in the zero-voltage period is measured.

15. The measurement apparatus according to claim 12, wherein a signal-processing unit of the signal voltage includes a delay unit for the signal voltage.

16. The measurement apparatus according to claim 15, wherein the signal-processing unit includes a timing generator, the timing generator being configured to generate a timing signal in the excitation period and the zero-voltage period and transmit the timing signal to the delay unit.

17. The measurement apparatus according to claim 12, wherein the transducer element is a magneto-resistive element whose resistance changes depending on a direction or intensity of an external magnetic field.

18. The measurement apparatus according to claim 17, wherein
the magneto-resistive element is a giant magneto-resistive element having a pinned magnetic layer with a pinned magnetization direction and a free magnetic layer, and
the four magneto-resistive elements include two magneto-resistive elements of a first type whose pinned magnetic layers are magnetized in a first direction, and two magneto-resistive elements of a second type whose pinned magnetic layers are magnetized in a second direction.

* * * * *